United States Patent
Hata et al.

(10) Patent No.: US 7,829,900 B2
(45) Date of Patent: Nov. 9, 2010

(54) NITRIDE-BASED SEMICONDUCTOR ELEMENT AND METHOD OF FORMING NITRIDE-BASED SEMICONDUCTOR

(75) Inventors: Masayuki Hata, Kadoma (JP); Tatsuya Kunisato, Takatsuki (JP); Nobuhiko Hayashi, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/071,978

(22) Filed: Feb. 28, 2008

(65) Prior Publication Data

US 2008/0224151 A1 Sep. 18, 2008

Related U.S. Application Data

(63) Continuation of application No. 11/195,637, filed on Aug. 3, 2005, now Pat. No. 7,355,208, which is a continuation of application No. 10/081,180, filed on Feb. 25, 2002, now Pat. No. 6,994,751.

(30) Foreign Application Priority Data

Feb. 27, 2001 (JP) ............................. 2001-051348

(51) Int. Cl.
H01L 27/15 (2006.01)
(52) U.S. Cl. .................. 257/79; 257/618; 257/E21.119
(58) Field of Classification Search ............... 257/79, 257/618, E21.119
See application file for complete search history.

(56) References Cited

U.S. PATENT DOCUMENTS 4,396,929 A 8/1983 Ohki et al.

(Continued)

FOREIGN PATENT DOCUMENTS

JP 56-060076 5/1981

(Continued)

OTHER PUBLICATIONS

Robert F. Davis et al., "Pendeo-epitaxial Growth and Characterization of Gallium Nitride and Related Materials", Technical Digest, International Workshop on Nitride Semiconductors, IWN2000, Sep. 24-27, 2000, pp. 79-81.

(Continued)

*Primary Examiner*—Mark Prenty
(74) *Attorney, Agent, or Firm*—McDermott Will & Emery LLP

(57) ABSTRACT

A nitride-based semiconductor element having superior mass productivity and excellent element characteristics is obtained. This nitride-based semiconductor element comprises a substrate comprising a surface having projection portions, a mask layer formed to be in contact with only the projection portions of the surface of the substrate, a first nitride-based semiconductor layer formed on recess portions of the substrate and the mask layer and a nitride-based semiconductor element layer, formed on the first nitride-based semiconductor layer, having an element region. Thus, the first nitride-based semiconductor layer having low dislocation density is readily formed on the projection portions of the substrate and the mask layer through the mask layer serving for selective growth. When the nitride-based semiconductor element layer having the element region is grown on the first nitride-based semiconductor layer having low dislocation density, a nitride-based semiconductor element having excellent element characteristics can be readily obtained. The first nitride-based semiconductor layer is formed through only single growth on the substrate, whereby a nitride-based semiconductor element having excellent mass productivity is obtained.

11 Claims, 14 Drawing Sheets

U.S. PATENT DOCUMENTS

| | | | |
|---|---|---|---|
| 5,777,350 | A | 7/1998 | Nakamura et al. |
| 6,015,979 | A | 1/2000 | Sugiura et al. |
| 6,091,083 | A | 7/2000 | Hata et al. |
| 6,121,121 | A | 9/2000 | Koide |
| 6,153,010 | A | 11/2000 | Kiyoku et al. |
| 6,201,823 | B1 | 3/2001 | Kimura et al. |
| 6,232,623 | B1 | 5/2001 | Morita |
| 6,316,785 | B1 | 11/2001 | Nunoue et al. |
| 6,335,546 | B1 * | 1/2002 | Tsuda et al. .................. 257/94 |
| 6,348,096 | B1 | 2/2002 | Sunakawa et al. |
| 6,576,533 | B2 | 6/2003 | Tomiya et al. |
| 6,617,182 | B2 | 9/2003 | Ishida et al. |
| 6,673,149 | B1 | 1/2004 | Solomon et al. |
| 6,835,956 | B1 | 12/2004 | Nagahama et al. |
| 6,864,160 | B2 | 3/2005 | Linthicum et al. |
| 6,940,098 | B1 | 9/2005 | Tadatomo et al. |
| 6,994,751 | B2 | 2/2006 | Hata et al. |
| 7,355,208 | B2 * | 4/2008 | Hata et al. .................... 257/79 |
| 2001/0026950 | A1 | 10/2001 | Sunakawa et al. |
| 2001/0040246 | A1 | 11/2001 | Ishii |
| 2001/0041427 | A1 | 11/2001 | Gehrke et al. |

FOREIGN PATENT DOCUMENTS

| | | |
|---|---|---|
| JP | 08-264901 | 10/1996 |
| JP | 09-321381 | 12/1997 |
| JP | 10-312971 | 11/1998 |
| JP | 11-145516 | 5/1999 |
| JP | 11-191657 | 7/1999 |
| JP | 11-219910 | 8/1999 |
| JP | 11-238687 | 8/1999 |
| JP | 2000-106455 | 4/2000 |
| JP | 2000-124500 | 4/2000 |
| JP | 2000-156348 | 6/2000 |
| JP | 2000-156524 | 6/2000 |
| JP | 2000-1649929 | 6/2000 |
| JP | 2000-244061 | 9/2000 |
| JP | 2000-277437 | 10/2000 |
| JP | 2000-299497 | 10/2000 |
| JP | 2000-331937 | 11/2000 |
| JP | 2001-053012 | 2/2001 |

OTHER PUBLICATIONS

Kazuyuki Tadatomo, "High Output Power InGaN Ultraviolet Light-Emitting Diodes Fabricated on Patterned Substrates Using Metalorganic Vapor Phase Epitaxy", Jpn. J. Appl. Phys., vol. 40, (2001), pp. L583-L585.

Tsvetanka S. Zheleva., et al., "Pendeo-Epitaxy: A New Approach for Lateral Growth of Gallium Nitride Films", Journal of Electronic Materials, 1999, pp. L5-L8, vol. 28, No. 4.

* cited by examiner

US 7,829,900 B2

NITRIDE-BASED SEMICONDUCTOR ELEMENT AND METHOD OF FORMING NITRIDE-BASED SEMICONDUCTOR

RELATED APPLICATIONS

This application is a Continuation of U.S. application Ser. No. 11/195,637, filed Aug. 3, 2005, now U.S. Pat. No. 7,355,208, which is a Continuation of U.S. Ser. No. 10/081,180, filed Feb. 25, 2002, now U.S. Pat. No. 6,994,751, claiming priority of Japanese Application No. 2001-051348, filed Feb. 27, 2001, the entire contents of each of which are hereby incorporated by reference.

BACKGROUND OF THE INVENTION

1. Field of the Invention

The present invention relates to a nitride-based semiconductor element and a method of forming a nitride-based semiconductor, and more specifically, it relates to a nitride-based semiconductor element including a nitride-based semiconductor layer formed by epitaxial lateral overgrowth and a method of forming a nitride-based semiconductor.

2. Description of the Prior Art

In recent years, a nitride-based semiconductor element utilizing a group III nitride-based semiconductor is actively developed as a semiconductor element employed for a semiconductor light-emitting device such as a light-emitting diode device or a semiconductor laser device or an electronic device such as a transistor. In order to fabricate such a nitride-based semiconductor element, a nitride-based semiconductor layer is epitaxially grown on a substrate consisting of sapphire or the like.

In this case, the substrate of sapphire or the like and the nitride-based semiconductor layer have different lattice constants and hence the nitride-based semiconductor layer grown on the substrate of sapphire or the like has dislocations (lattice defects) vertically extending from the substrate to the surface of the semiconductor layer. Such dislocations in the nitride-based semiconductor layer result in deterioration of the element characteristics of the semiconductor element and reduction of the reliability thereof.

As a method of reducing the density of the aforementioned dislocations in the nitride-based semiconductor layer, epitaxial lateral growth is generally proposed. This epitaxial lateral growth is disclosed in International Workshop on Nitride Semiconductors-IWN2000-, Nagoya, Japan, 2000, p. 79, for example.

FIGS. 29 to 33 are sectional views for illustrating a conventional method of forming a nitride-based semiconductor employing epitaxial lateral overgrowth. The conventional method of forming a nitride-based semiconductor employing epitaxial lateral overgrowth is now described with reference to FIGS. 29 to 33.

First, a GaN layer 102 for serving as an underlayer is formed on a substrate 101 consisting of sapphire or SiC, as shown in FIG. 29. Then, mask layers 103 are formed on prescribed regions of the GaN layer 102.

Then, portions of the GaN layer 102 located under regions formed with no mask layers 103 are removed by etching while etching the substrate 101 by a thickness in the range not reaching the bottom surface thereof through the mask layers 103 serving for etching in this process. Thus, the substrate 101 is brought into a ridged shape, while stripe-patterned GaN layers 102 to be in contact substantially with the overall upper surfaces of projection portions of the substrate 101, as shown in FIG. 30.

Then, undoped GaN layers 104 are re-grown from exposed side surfaces, serving as seed crystals, of the GaN layers 102, as shown in FIG. 31. The undoped GaN layers 104 are laterally grown in an initial stage. From the state shown in FIG. 31, the undoped GaN layers 104 are grown upward while laterally growing on the mask layers 103 serving for selective growth in this process, as shown in FIG. 32. At this time, voids 105 are formed between the undoped GaN layers 104 and the bottom surfaces of recess portions of the substrate 101. The undoped GaN layers 104 laterally growing on the mask layers 103 coalesce into a continuous undoped GaN layer 104 having a flattened surface, as shown in FIG. 33.

In the conventional method of forming a nitride-based semiconductor, as hereinabove described, the undoped GaN layer 102 is formed by epitaxial lateral overgrowth from the exposed side surfaces of the GaN layers 102 serving as seed crystals, whereby lattice defects are scarcely propagated from the GaN layers 102 to a portion around the surface of the undoped GaN layer 104. Thus, the undoped GaN layer 104 reduced in dislocation density is obtained. When a nitride-based semiconductor element layer (not shown) having an element region is formed on such an undoped GaN layer 104 reduced in dislocation density, a nitride-based semiconductor element having excellent crystallinity can be formed.

In the aforementioned conventional method of forming a nitride-based semiconductor employing epitaxial lateral overgrowth, however, the substrate 101 is brought into the ridged shape by removing the portions of the GaN layers 102 located under the regions formed with no mask layers 103 by etching and thereafter further etching the substrate 101. In general, therefore, the layers GaN 102, which are hardly etched nitride-based semiconductor layers, must be etched along the overall thicknesses thereof while the surface of the substrate 101 must also be etched. Thus, the etching time for bringing the substrate 101 into the ridged shape is disadvantageously increased. Consequently, the nitride-based semiconductor is disadvantageously reduced in mass productivity.

In the aforementioned conventional method of forming a nitride-based semiconductor employing epitaxial lateral overgrowth, further, the undoped GaN layer 104 is formed by growing the GaN layers 102 serving as underlayers on the substrate 101 and thereafter epitaxially laterally overgrowing the GaN layers 102. Therefore, this method requires two crystal growth steps for the GaN layers 102 and the undoped GaN layer 104. In general, therefore, the nitride-based semiconductor is reduced in mass productivity also in this point.

SUMMARY OF THE INVENTION

An object of the present invention is to provide a nitride-based semiconductor element having superior mass productivity and excellent element characteristics.

Another object of the present invention is to provide a method of forming a nitride-based semiconductor capable of obtaining a nitride-based semiconductor layer having excellent mass productivity and low dislocation density.

A nitride-based semiconductor element according to a first aspect of the present invention comprises a substrate comprising a surface having projection portions, a mask layer formed to be in contact with only the projection portions of the surface of the substrate, a first nitride-based semiconductor layer formed on recess portions of the substrate and the mask layer, and a nitride-based semiconductor element layer, formed on the first nitride-based semiconductor layer, having an element region.

The nitride-based semiconductor element according to the first aspect is provided with the substrate comprising a surface having projection portions and the mask layer formed to be in contact with only the projection portions of the surface of the substrate as hereinabove described, whereby the first nitride-based semiconductor layer having low dislocation density can be readily formed on the recess portions of the substrate and the mask layer through the mask layer serving for selective growth. When the nitride-based semiconductor element layer having the element region is grown on the first nitride-based semiconductor layer having low dislocation density, a nitride-based semiconductor element having excellent element characteristics can be readily obtained. Further, only the surface of the substrate may be etched for forming the projection portions. Thus, the etching time for forming the projection portions can be reduced. According to the first aspect, further, the first nitride-based semiconductor layer can be formed through single growth on the substrate. Consequently, a nitride-based semiconductor element having excellent mass productivity can be obtained.

In the aforementioned nitride-based semiconductor element according to the first aspect, the substrate preferably includes a substrate selected from a group consisting of a sapphire substrate, a spinel substrate, an Si substrate, an SiC substrate, a GaN substrate, a GaAs substrate, a GaP substrate, an InP substrate, a $ZrB_2$ substrate and a quartz substrate. In this case, the substrate preferably includes a sapphire substrate, while the mask layer and the projection portions of the surface of the substrate are preferably formed in the shape of stripes being parallel to the [1-100] direction of the sapphire substrate. The substrate preferably includes an Si substrate, and the mask layer and the projection portions of the surface of the substrate are preferably formed in the shape of stripes being parallel to the [1-10] direction of the Si substrate.

The aforementioned nitride-based semiconductor element according to the first aspect preferably further comprises a buffer layer formed on the interface between the recess portions of the substrate and the first nitride-based semiconductor layer. According to this structure, the first nitride-based semiconductor layer having lower dislocation density can be formed on the buffer layer.

A nitride-based semiconductor element according to a second aspect of the present invention comprises an underlayer, formed on a substrate, consisting of a nitride-based semiconductor and comprising a surface having projection portions, a mask layer formed to be in contact with only the projection portions of the surface of the underlayer, a first nitride-based semiconductor layer formed on recess portions of the underlayer and the mask layer, and a nitride-based semiconductor element layer, formed on the first nitride-based semiconductor layer, having an element region.

The nitride-based semiconductor element according to the second aspect is provided with the underlayer comprising the surface having the projection portions and the mask layer formed to be in contact with only the projection portions of the surface of the underlayer as described above, whereby the first nitride-based semiconductor layer having low dislocation density can be readily formed on the recess portions of the underlayer and the mask layer through the mask layer serving for selective growth. When the nitride-based semiconductor element layer having the element region is grown on the first nitride-based semiconductor layer having low dislocation density, a nitride-based semiconductor element having excellent element characteristics can be readily obtained. Only the surface of the underlayer consisting of a nitride-based semiconductor may be etched for forming the projection portions on the surface. Thus, the etching time for forming the projection portions on the surface can be reduced, and a nitride-based semiconductor element having excellent mass productivity can be obtained as a result.

The aforementioned nitride-based semiconductor element according to the second aspect preferably further comprises a buffer layer formed between the substrate and the underlayer. According to this structure, the underlayer consisting of a nitride-based semiconductor having low dislocation density can be readily formed on the buffer layer.

In the aforementioned nitride-based semiconductor element according to the second embodiment, the substrate preferably includes a substrate selected from a group consisting of a sapphire substrate, a spinel substrate, an Si substrate, an SiC substrate, a GaAs substrate, a GaP substrate, an InP substrate, a $ZrB_2$ substrate and a quartz substrate.

In the aforementioned nitride-based semiconductor element according to the second aspect, the underlayer preferably includes a GaN layer, and the mask layer and the projection portions of the surface of the underlayer are preferably formed in the shape of stripes being parallel to the [11-20] direction or the [1-100] direction of the GaN layer.

A method of forming a nitride-based semiconductor according to a third aspect of the present invention comprises steps of forming projection portions on a surface on a substrate, forming a mask layer to be in contact with only the projection portions of the surface of the substrate and growing a first nitride-based semiconductor layer on recess portions of the substrate and the mask layer through the mask layer serving for selective growth.

In the method of forming a nitride-based semiconductor according to the third embodiment, the surface having the projection portions is formed on the substrate while the mask layer is formed to be in contact with only the projection portions of the surface of the substrate, whereby the first nitride-based semiconductor layer having low dislocation density can be readily formed on the recess portions of the substrate and the mask layer when grown through the mask layer serving for selective growth. Further, only the surface of the substrate may be etched for forming the projection portions on the surface. Thus, the etching time for forming the projection portions on the surface can be reduced. According to the third aspect, further, the first nitride-based semiconductor layer can be formed through single growth on the substrate. Consequently, a method of forming a nitride-based semiconductor excellent in mass productivity can be obtained.

The aforementioned method of forming a nitride-based semiconductor according to the third aspect preferably further comprises a step of forming a buffer layer on the recess portions of the substrate in advance of the step of growing the first nitride-based semiconductor layer. According to this structure, the first nitride-based semiconductor layer having lower dislocation density can be formed on the buffer layer.

In the aforementioned method of forming a nitride-based semiconductor according to the third aspect, the steps of forming the projection portions on the surface on the substrate and forming the mask layer preferably include a step of forming the mask layer on the surface of the substrate and thereafter etching the surface of the substrate through the mask layer serving for etching in this step thereby simultaneously forming the projection portions on the surface of the substrate and the mask layer coming into contact with only the projection portions of the surface. According to this method, the mask layer serving for etching simultaneously serves for selective growth, whereby the fabrication process can be simplified.

The aforementioned method of forming a nitride-based semiconductor according to the third aspect preferably further comprises a step of growing a nitride-based semiconductor element layer having an element region on the first nitride-based semiconductor layer. According to this structure, the nitride-based semiconductor element layer having the element region can be grown on the first nitride-based semiconductor layer having low dislocation density, whereby a nitride-based semiconductor element having excellent element characteristics can be readily formed.

In the aforementioned method of forming a nitride-based semiconductor according to the third aspect, the substrate preferably includes a substrate selected from a group consisting of a sapphire substrate, a spinel substrate, an Si substrate, an SiC substrate, a GaN substrate, a GaAs substrate, a GaP substrate, an InP substrate, a $ZrB_2$ substrate and a quartz substrate. In this case, the substrate preferably includes a sapphire substrate, and the mask layer and the projection portions of the surface of the substrate are preferably formed in the shape of stripes being parallel to the [1-100] direction of the sapphire substrate. Alternatively, the substrate preferably includes an Si substrate, and the mask layer and the projection portions of the surface of the substrate are preferably formed in the shape of stripes being parallel to the [1-10] direction of the Si substrate.

A method of forming a nitride-based semiconductor according to a fourth aspect of the present invention comprises steps of forming an underlayer consisting of a nitride-based semiconductor on a substrate, forming projection portions on a surface on the underlayer, forming a mask layer to be in contact with only the projection portions of the surface of the underlayer and growing a first nitride-based semiconductor layer on recess portions of the underlayer and the mask layer through the mask layer serving for selective growth.

In the method of forming a nitride-based semiconductor according to the fourth aspect, the surface having the projection portions is formed on the underlayer consisting of a nitride-based semiconductor layer provided on the substrate while the mask layer is formed to be in contact with only the projection portions of the surface of the underlayer, whereby the first nitride-based semiconductor layer having low dislocation density can be readily formed on the recess portions of the underlayer and the mask layer when grown through the mask layer serving for selective growth. Further, only the surface of the underlayer consisting of a nitride-based semiconductor may be etched for forming the projection portions on the surface. Thus, the etching time for forming the projection portions on the surface can be reduced, and a method of forming a nitride-based semiconductor having excellent mass productivity can be provided as a result.

The aforementioned method of forming a nitride-based semiconductor according to the fourth aspect preferably further comprises a step of forming a buffer layer on the substrate in advance of the step of forming the underlayer consisting of a nitride-based semiconductor. According to this structure, the underlayer consisting of a nitride-based semiconductor having low dislocation density can be readily formed on the buffer layer.

In the aforementioned method of forming a nitride-based semiconductor according to the fourth aspect, the steps of forming the projection portions on the surface on the underlayer and forming the mask layer preferably include a step of forming the mask layer on the surface of the underlayer and thereafter etching the surface of the underlayer through the mask layer serving for etching in this step thereby simultaneously forming the projection portions on the surface of the underlayer and the mask layer coming into contact with only the projection portions of the surface. According to this method, the mask layer serving for etching simultaneously serves for selective growth, whereby the fabrication process can be simplified.

The aforementioned method of forming a nitride-based semiconductor according to the fourth aspect preferably further comprises a step of growing a nitride-based semiconductor element layer having an element region on the first nitride-based semiconductor layer. According to this structure, the nitride-based semiconductor element layer having the element region can be grown on the first nitride-based semiconductor layer having low dislocation density, whereby a nitride-based semiconductor element having excellent element characteristics can be readily formed.

In the aforementioned method of forming a nitride-based semiconductor according to the fourth aspect, the substrate preferably includes a substrate selected from a group consisting of a sapphire substrate, a spinel substrate, an Si substrate, an SiC substrate, a GaAs substrate, a GaP substrate, an InP substrate, a $ZrB_2$ substrate and a quartz substrate.

In the aforementioned method of forming a nitride-based semiconductor according to the fourth aspect, the underlayer preferably includes a GaN layer, and the mask layer and the projection portions of the surface of the underlayer are preferably formed in the shape of stripes being parallel to the [11-20] direction or the [1-100] direction of the GaN layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

A method of forming a nitride-based semiconductor according to a first embodiment of the present invention is described with reference to FIGS. 1 to 6.

Figure 1:
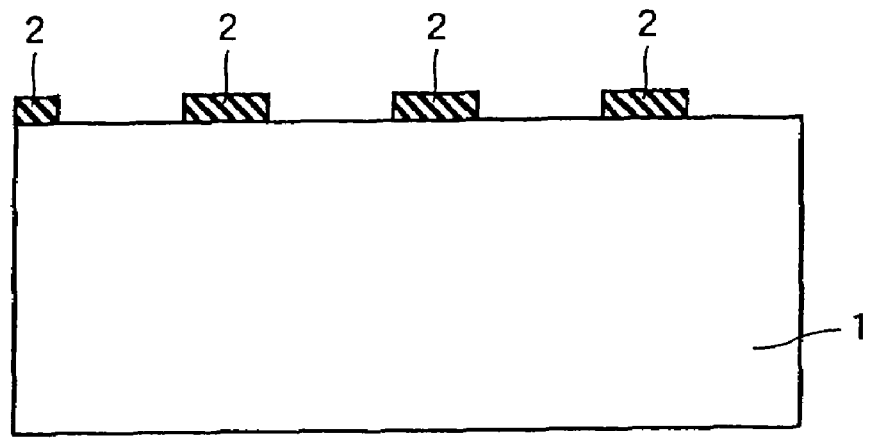
FIGS. 1 to 6 are sectional views for illustrating a method of forming a nitride-based semiconductor according to a first embodiment of the present invention.

First, striped mask layers 2 of $SiO_2$ having a thickness of about 0.5 µm are formed on a sapphire (0001) plane substrate 1 (hereinafter referred to as "sapphire substrate 1"), as shown in FIG. 1. The stripe patterns of the mask layers 2 are formed in a cycle of about 7 µm so that the width of the mask layers 2 is about 5 µm and the interval between each adjacent pair of mask layers 2 (the width of mask openings) is about 2 µm. The striped mask layers 2 are formed in parallel to the [1-100] direction of the sapphire substrate 1. The sapphire substrate 1 is an example of the "substrate" according to the present invention.

Figure 2:
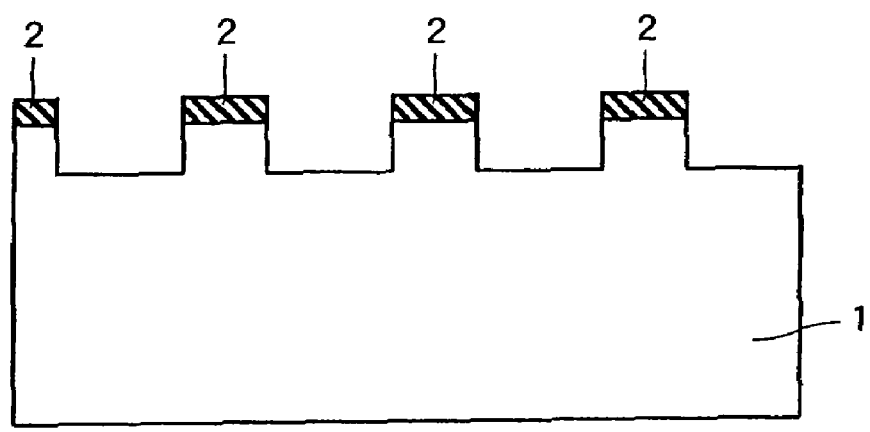

The mask layers 2 are employed as masks for etching the surface of the sapphire substrate 1 by a thickness of about 1 µm through RIE (reactive ion etching) or the like. Thus, the surface of the sapphire substrate 1 is brought into an uneven shape, as shown in FIG. 2. The shape of the projection portions varies with etching conditions, such that upper parts of recess portions may be larger or smaller in width than bottom parts thereof. In the following description, side surfaces of the recess portions of the etched sapphire substrate 1 are nearly perpendicular to the upper surface of projection portions of the sapphire substrate 1. The uneven surface of the sapphire substrate 1 has ridges of a height of about 1 µm and grooves of a terrace width of about 2 µm, and they are formed in parallel to the [1-100] direction of the sapphire substrate 1.

Figure 3:
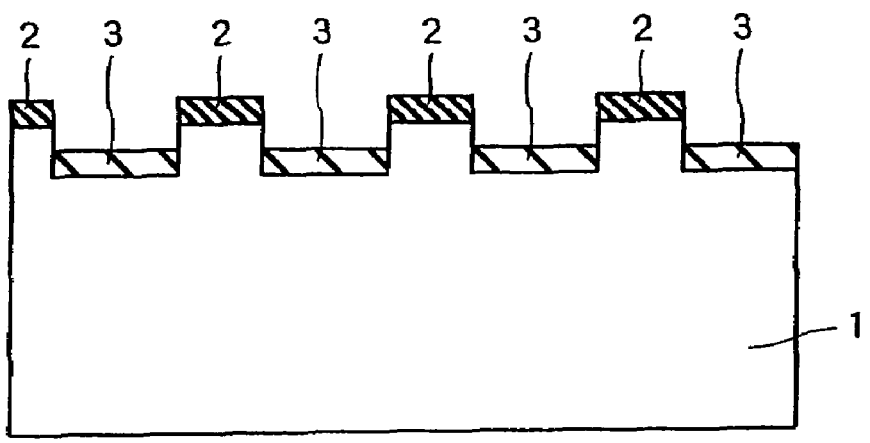

Then, low-temperature buffer layers 3 of GaN having a thickness of about 15 nm are grown by a crystal growth method such as MOVPE (metal organic vapor phase epitaxy) to be in contact substantially with the overall bottom surfaces of the recess portions of the sapphire substrate 1, as shown in FIG. 3. In this case, the low-temperature buffer layers 3 are hardly formed on the mask layers 2 consisting of $SiO_2$. Alternatively, the low-temperature buffer layers 3 may be formed not only on the bottom surfaces but also on the side surfaces of the recess portions. The low-temperature buffer layers 3 may not be formed on the overall bottom surfaces of the recess portions but may be partially formed on the bottom surfaces of the recess portions. The low-temperature buffer layers 3 are examples of the "buffer layer" according to the present invention.

Figure 4:
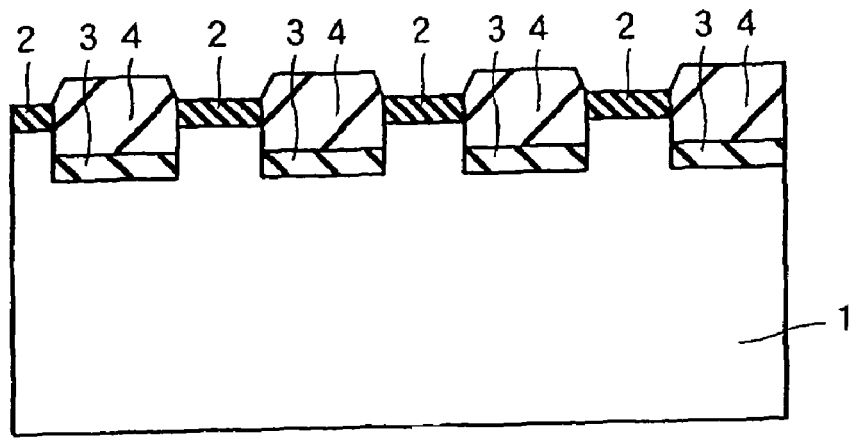

Then, undoped GaN layers 4 are grown on the low-temperature buffer layers 3 consisting of GaN. In this case, the low-temperature buffer layers 3 and the undoped GaN layers 4 are successively grown without taking the sapphire substrate 1 out of the growth apparatus. In an initial stage, the undoped GaN layers 4 are vertically (upwardly) grown on the low-temperature buffer layers 3. If the low-temperature buffer layers 3 are formed on the side surfaces of the recess portions, the undoped GaN layers 4 are grown laterally from the low-temperature buffer layers 3 formed on the side surfaces. When this growth is further continued, undoped GaN layers 4 having facets on side surfaces thereof are formed on the recess portions, as shown in FIG. 4. The undoped GaN layers 4 are examples of the "first nitride-based semiconductor layer" according to the present invention.

Figure 5:
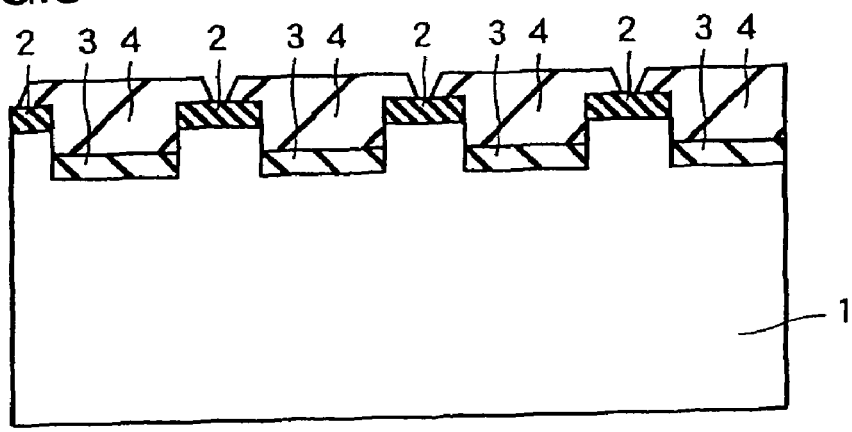
Figure 6:
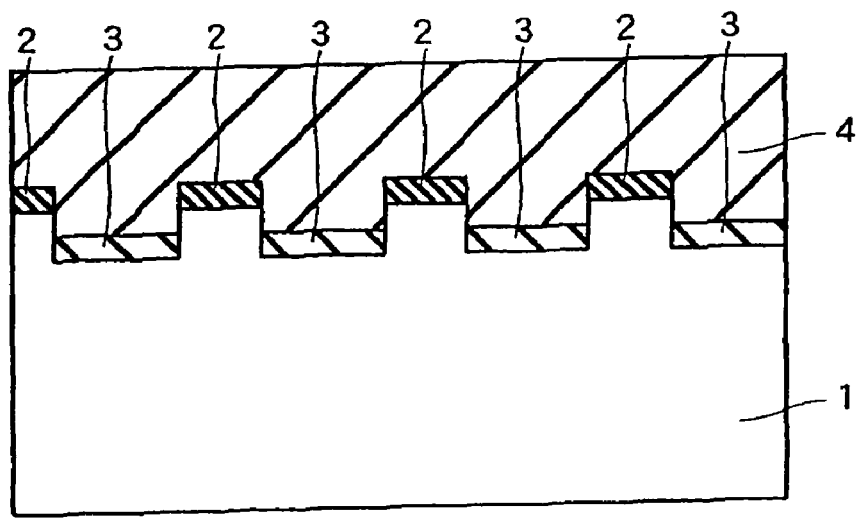

From the state shown in FIG. 4, the undoped GaN layers 4 are laterally grown on the mask layers 2, as shown in FIG. 5. The undoped GaN layers 4 laterally grown on the mask layers 2 coalesce into a continuous undoped GaN layer 4 of about 5 µm in thickness having a flattened surface, as shown in FIG. 6.

In the method of forming a nitride-based semiconductor according to the first embodiment, the undoped GaN layers 4 are grown from the recess portions of the sapphire substrate 1 as hereinabove described, whereby dislocations of the undoped GaN layers 4 are bent in the in-plane direction of the (0001) plane of the undoped GaN layers 4 when the undoped GaN layers 4 are laterally grown from the low-temperature buffer layers 3 formed on the side surfaces of the recess portions or on the mask layers 2. Thus, the dislocation density can be reduced around the surfaces of the undoped GaN layers 4.

Figure 30:
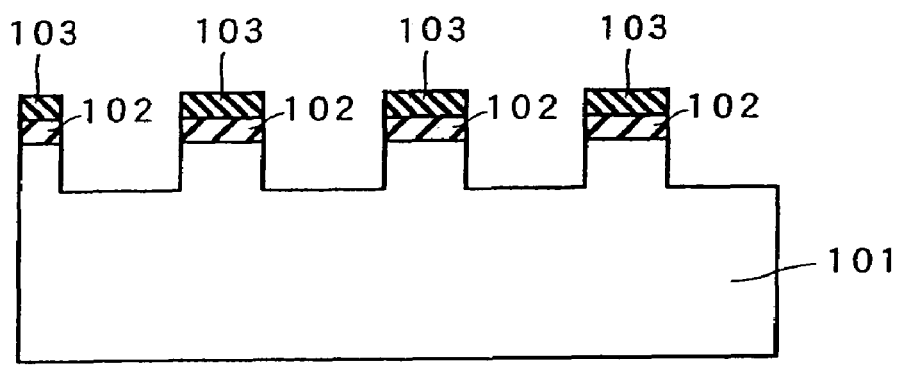
Figure 31:
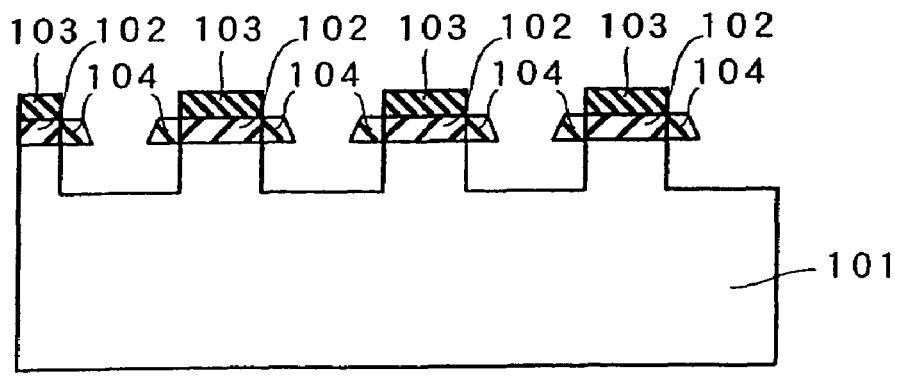
Figure 32:
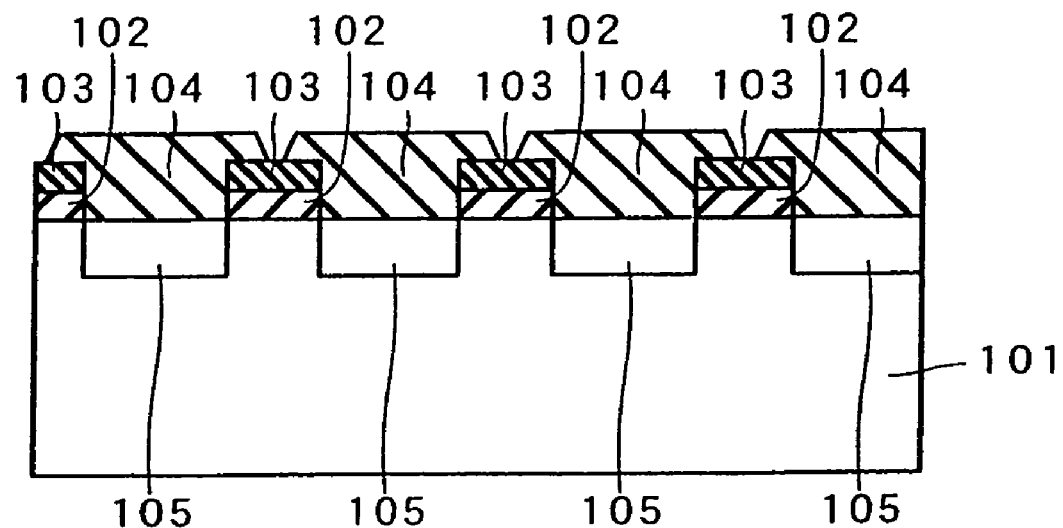
Figure 33:
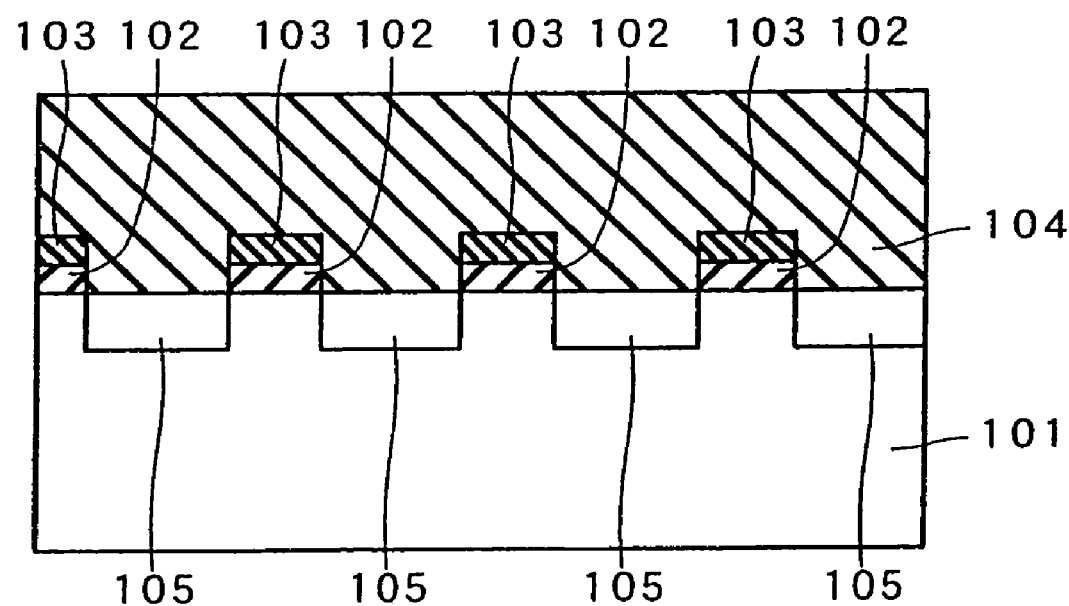

In the method of forming a nitride-based semiconductor according to the first embodiment, the surface of the sapphire substrate 1 is brought into an uneven shape as hereinabove described, whereby only the surface of the sapphire substrate 1 may be etched through the mask layers 2 serving for etching. Thus, the etching time for forming the projection portions on the surface on the sapphire substrate 1 can be reduced as compared with the conventional process of forming the projection portions on the surface shown in FIG. 30. Consequently, a method of forming a nitride-based semiconductor having excellent mass productivity can be obtained.

In the method of forming a nitride-based semiconductor according to the first embodiment, growth of the low-temperature buffer layers 3 of GaN formed on the recess portions of the sapphire substrate 1 and selective growth of the undoped GaN layer 4 are successively performed without taking the sapphire substrate 1 out of the growth apparatus, as hereinabove described. Thus, the undoped GaN layer 4 having low dislocation density can be formed through a single growth step. A method of forming a nitride-based semiconductor having excellent mass productivity can be obtained also in this point.

In the method of forming a nitride-based semiconductor according to the first embodiment, further, the undoped GaN layer 4 is grown on the low-temperature buffer layers 3 provided on the sapphire substrate 1, whereby the undoped GaN layer 4 can be grown in lower dislocation density as compared with that directly grown on the sapphire substrate 1.

Figure 7:
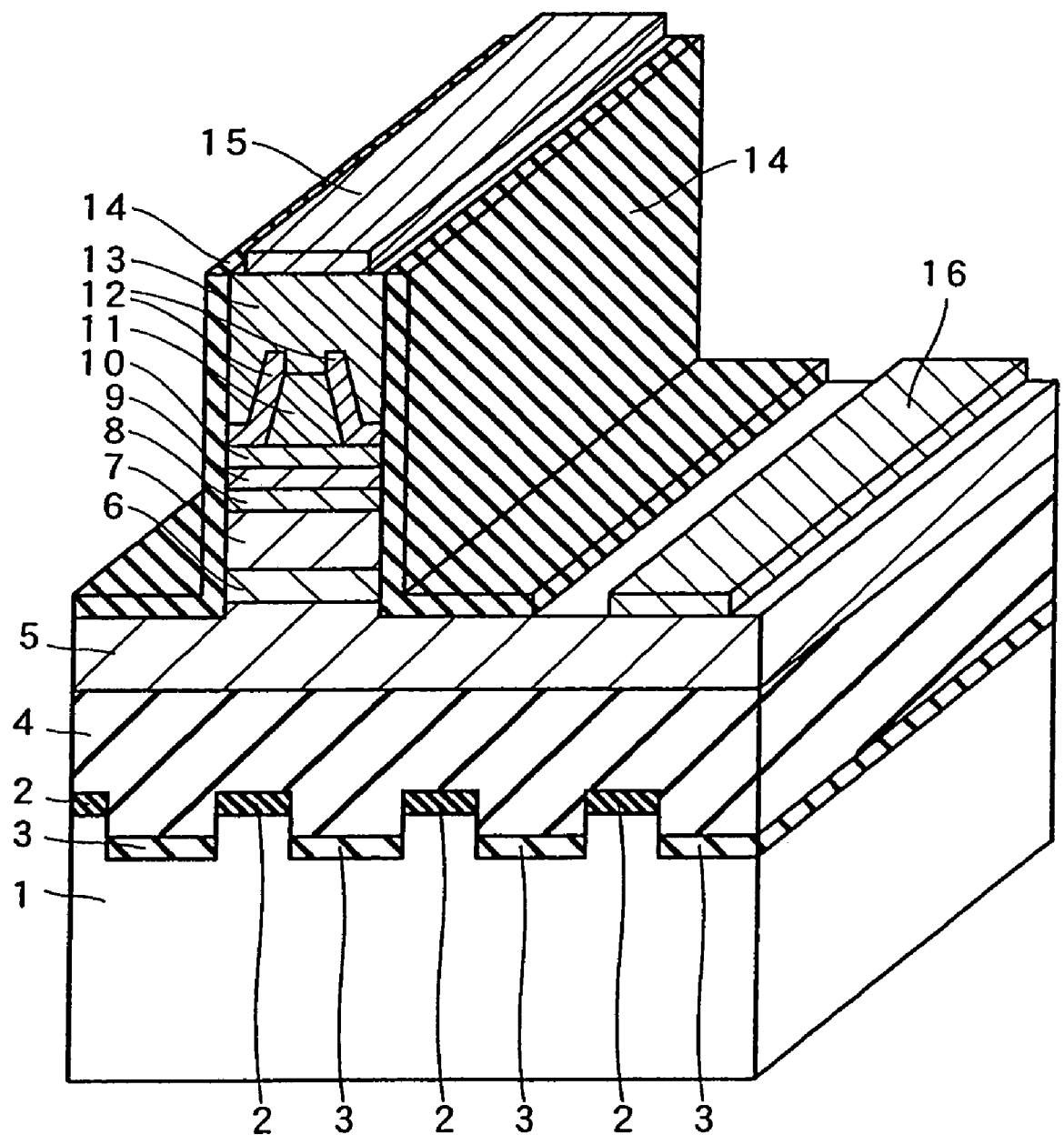
FIG. 7 is a perspective view showing a semiconductor laser device fabricated with the method of forming a nitride-based semiconductor according to the first embodiment of the present invention.

FIG. 7 is a perspective view showing a semiconductor laser device fabricated with the aforementioned method of forming a nitride-based semiconductor according to the first embodiment. The structure of the semiconductor laser device fabricated with the method of forming a nitride-based semiconductor according to the first embodiment is now described with reference to FIG. 7.

In the structure of the semiconductor laser device according to the first embodiment, an n-type contact layer 5 of n-type GaN having a thickness of about 4 µm is formed on the undoped GaN layer 4 according to the first embodiment shown in FIG. 6, as shown in FIG. 7. An anti-cracking layer 6 of n-type AlGaInN having a thickness of about 0.1 µm, an n-type second cladding layer 7 of n-type AlGaN having a thickness of about 0.45 µm, an n-type first cladding layer 8 of n-type GaN having a thickness of about 50 nm (about 0.05 µm) and a multiple quantum well (MQW) emission layer 9 of GaInN are successively formed on the n-type contact layer 5. The MQW emission layer 9 is formed by alternately stacking five undoped GaN barrier layers of about 4 nm in thickness and four compressive strain undoped GaInN well layers of about 4 nm in thickness.

A p-type first cladding layer 10 of p-type GaN having a thickness of about 40 nm (about 0.04 μm) is formed on the MQW emission layer 9. A mesa (trapezoidal) p-type second cladding layer 11 of p-type AlGaN having a height of about 0.45 μm is formed on the p-type first cladding layer 10. Current blocking layers 12 of n-type GaN having a thickness of about 0.2 μm are formed to cover regions on the p-type first cladding layer 10 other than that formed with the p-type second cladding layer 11 and the side surfaces of the mesa p-type second cladding layer 11 while exposing the upper surface of the p-type second cladding layer 11. A p-type contact layer 13 of p-type GaN having a thickness of about 3 μm to about 5 μm is formed on the current blocking layers 12 to be in contact with the exposed upper surface of the p-type second cladding layer 11.

The layers from the p-type contact layer 13 to the n-type contact layer 5 are partially removed. Protective films 14 of an insulator such as $SiO_2$ or SiN are formed to cover parts of the exposed surface of the n-type contact layer 5 and the exposed side surfaces of the anti-cracking layer 6, the n-type second cladding layer 7, the n-type first cladding layer 8, the MQW emission layer 9, the p-type first cladding layer 10, the current blocking layers 12 and the p-type contact layer 13.

A p-side electrode 15 is formed on the upper surface of the p-type contact layer 13 while an n-side electrode 16 is formed on the partially removed and exposed surface of the n-type contact layer 5.

The n-type contact layer 5, the anti-cracking layer 6, the n-type second cladding layer 7, the n-type first cladding layer 8, the MQW emission layer 9, the p-type first cladding layer 10, the p-type second cladding layer 11, the current blocking layers 12 and the n-type contact layer 13 are examples of the "nitride-based semiconductor element layer having an element region" according to the present invention.

In the semiconductor laser device according to the first embodiment, the undoped GaN layer 4 having excellent mass productivity and low dislocation density formed by the method of forming a nitride-based semiconductor according to the first embodiment shown in FIG. 1 to 6 is employed as an underlayer for forming the layers 5 to 13 thereon as hereinabove described, whereby excellent crystallinity can be implemented in the layers 5 to 13. Consequently, a semiconductor laser device having excellent mass productivity and excellent device characteristics can be obtained according to the first embodiment.

Second Embodiment

Referring to FIGS. 8 to 13, an n-type Si (111) plane substrate 21 (hereinafter referred to as "Si substrate 21") having conductivity is employed in a second embodiment of the present invention in place of the insulating sapphire substrate 1 in the first embodiment. A method of forming a nitride-based semiconductor according to the second embodiment is now described with reference to FIGS. 8 to 13.

Figure 8:
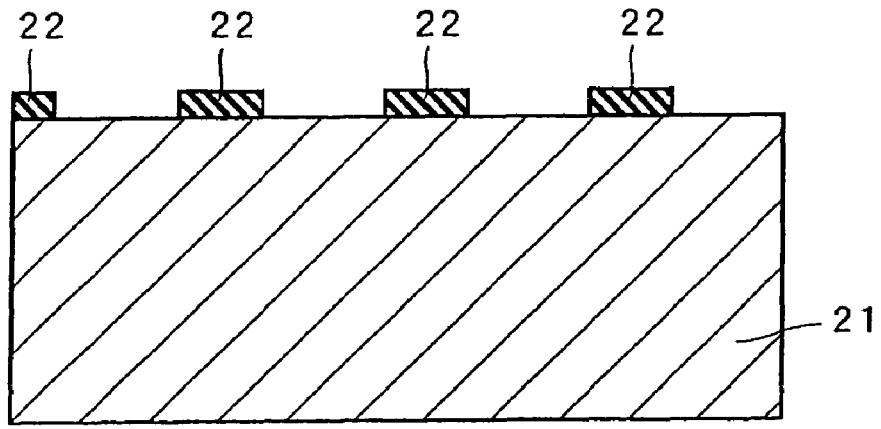
FIGS. 8 to 13 are sectional views for illustrating a method of forming a nitride-based semiconductor according to a second embodiment of the present invention.

According to the second embodiment, striped mask layers 22 of $SiO_2$ having a thickness of about 0.5 μm are formed on the n-type Si substrate 21, as shown in FIG. 8. The stripe patterns of the mask layers 22 are formed in a cycle of about 7 μm, so that the mask layers 22 are about 5 μm in width and the interval between each adjacent pair of mask layers 22 (the width of mask openings) is about 2 μm. The striped mask layers 22 are formed in parallel to the [1-10] direction of the Si substrate 21. The Si substrate 21 is an example of the "substrate" according to the present invention.

Figure 9:
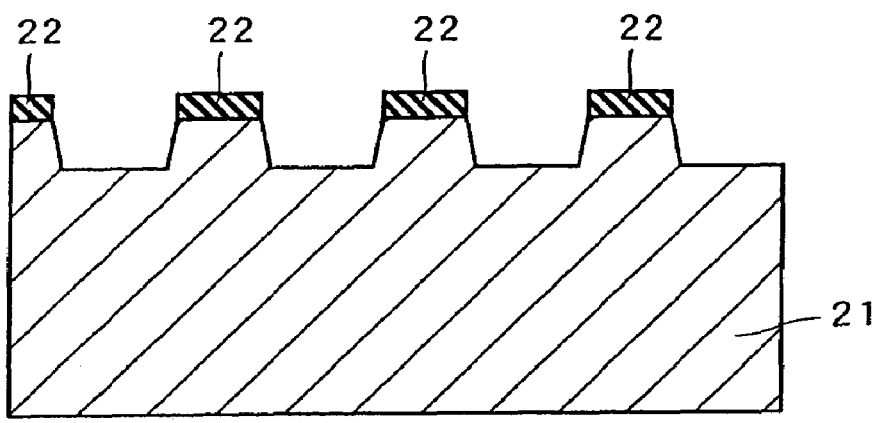

The mask layers 22 are employed as masks for etching the surface of the Si substrate 21 by a thickness of about 1 μm through wet etching or the like. Thus, the surface of the Si substrate 21 is brought into an uneven shape, as shown in FIG. 9. The shape of the projection portions varies with etching conditions, such that upper parts of recess portions may be larger or smaller in width than bottom parts thereof. In the following description, projection portions of the etched Si substrate 21 are in the form of a mesa (trapezoid). The uneven surface of the Si substrate 21 has ridges of a height of about 1 μm, and they are formed in parallel to the [1-10] direction of the Si substrate 21.

Figure 10:
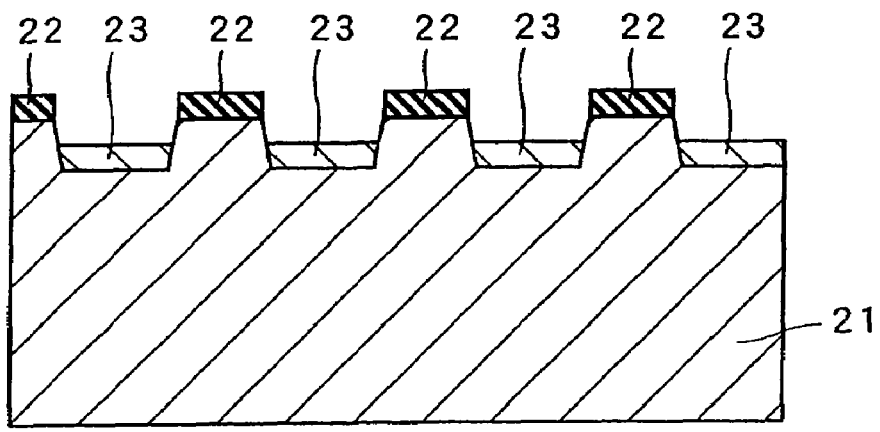

Then, buffer layers 23 of Si-doped AlGaN having a thickness of about 15 nm are grown by a crystal growth method such as MOVPE to be in contact substantially with the overall bottom surfaces of the recess portions of the Si substrate 21, as shown in FIG. 10. In this case, the buffer layers 23 are hardly formed on the mask layers 22 consisting of $SiO_2$. Alternatively, the buffer layers 23 may be formed not only on the bottom surfaces but also on the side surfaces of the recess portions. The buffer layers 23 may not be formed on the overall bottom surfaces of the recess portions but may be partially formed on the bottom surfaces of the recess portions.

Figure 11:
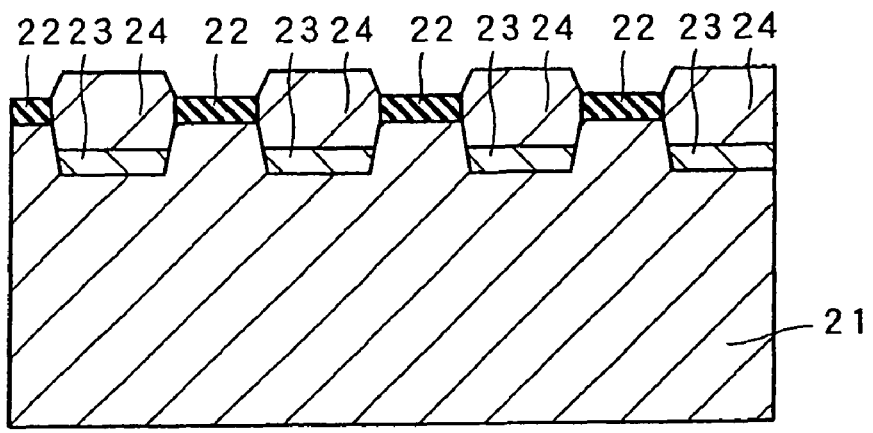

Then, Si-doped GaN layers 24 are grown on the buffer layers 23 consisting of Si-doped AlGaN. In this case, the buffer layers 23 and the Si-doped GaN layers 24 are successively grown without taking the Si substrate 21 out of the growth apparatus. In an initial stage, the Si-doped GaN layers 24 are vertically (upwardly) grown on the buffer layers 23. If the buffer layers 23 are formed on the side surfaces of the recess portions, the Si-doped GaN layers 24 are grown laterally from the buffer layers 23 formed on the side surfaces. When this growth is further continued, Si-doped GaN layers 24 having facets on side surfaces thereof are formed on the recess portions, as shown in FIG. 11. The Si-doped GaN layers 24 are examples of the "first nitride-based semiconductor layer" according to the present invention.

Figure 12:
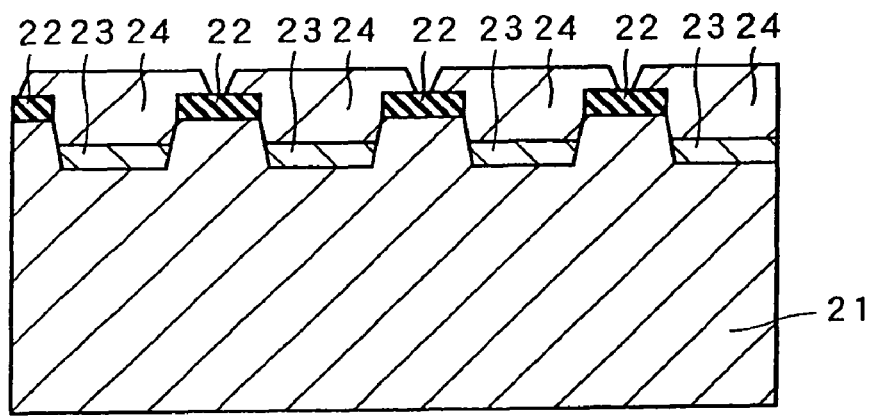
Figure 13:
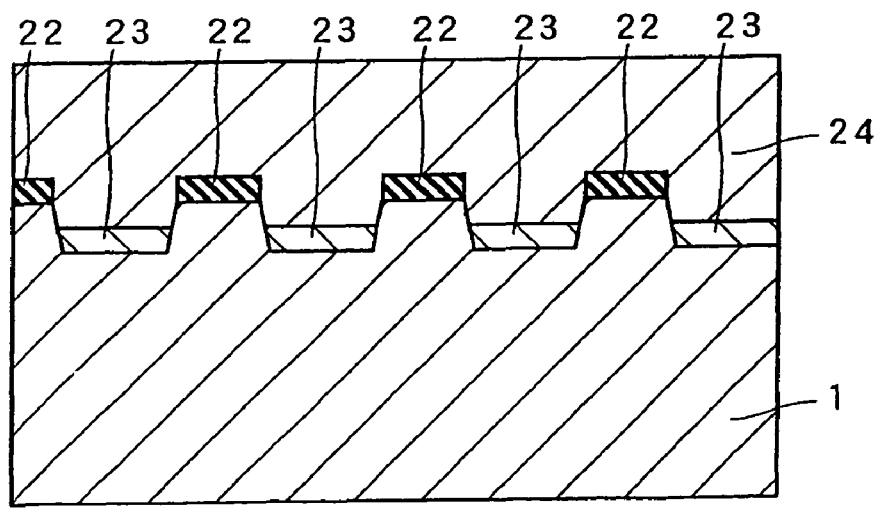

From the state shown in FIG. 11, the Si-doped GaN layers 24 are laterally grown on the mask layers 22, as shown in FIG. 12. The Si-doped GaN layers 24 laterally grown on the mask layers 22 coalesce into a continuous Si-doped GaN layer 24 of about 5 μm in thickness having a flattened surface, as shown in FIG. 13.

In the method of forming a nitride-based semiconductor according to the second embodiment, the Si-doped GaN layers 24 are grown from the recess portions of the Si substrate 21, whereby dislocations of the Si-doped GaN layers 24 are bent in the in-plane direction of the (0001) plane of the Si-doped GaN layers 24 when the Si-doped GaN layers 24 are laterally grown from the buffer layers 23 formed on the side surfaces of the recess portions or on the mask layers 22. Thus, the dislocation density can be reduced around the surfaces of the Si-doped GaN layers 24.

In the method of forming a nitride-based semiconductor according to the second embodiment, the surface of the Si substrate 21 is brought into an uneven shape similarly to the first embodiment, whereby only the surface of the Si substrate 21 may be etched through the mask layers 22 serving for etching. Thus, the etching time for forming the projection portions on the surface on the Si substrate 21 can be reduced as compared with the conventional process of forming the projection portions on the surface shown in FIG. 30. Consequently, a method of forming a nitride-based semiconductor having excellent mass productivity can be obtained.

In the method of forming a nitride-based semiconductor according to the second embodiment, growth of the buffer layers 23 of Si-doped AlGaN formed on the Si substrate 21 and selective growth of the Si-doped GaN layer 24 are successively performed without taking the Si substrate 21 out of the growth apparatus, similarly to the first embodiment. Thus, the Si-doped GaN layer 24 having low dislocation density can be formed through a single growth step. A method of forming a nitride-based semiconductor having excellent mass productivity can be obtained also in this point.

In the method of forming a nitride-based semiconductor according to the second embodiment, further, the Si-doped GaN layer 24 is grown on the buffer layers 23 provided on the Si substrate 21, whereby the Si-doped GaN layer 24 can be grown in lower dislocation density as compared with that directly grown on the Si substrate 21.

Figure 14:
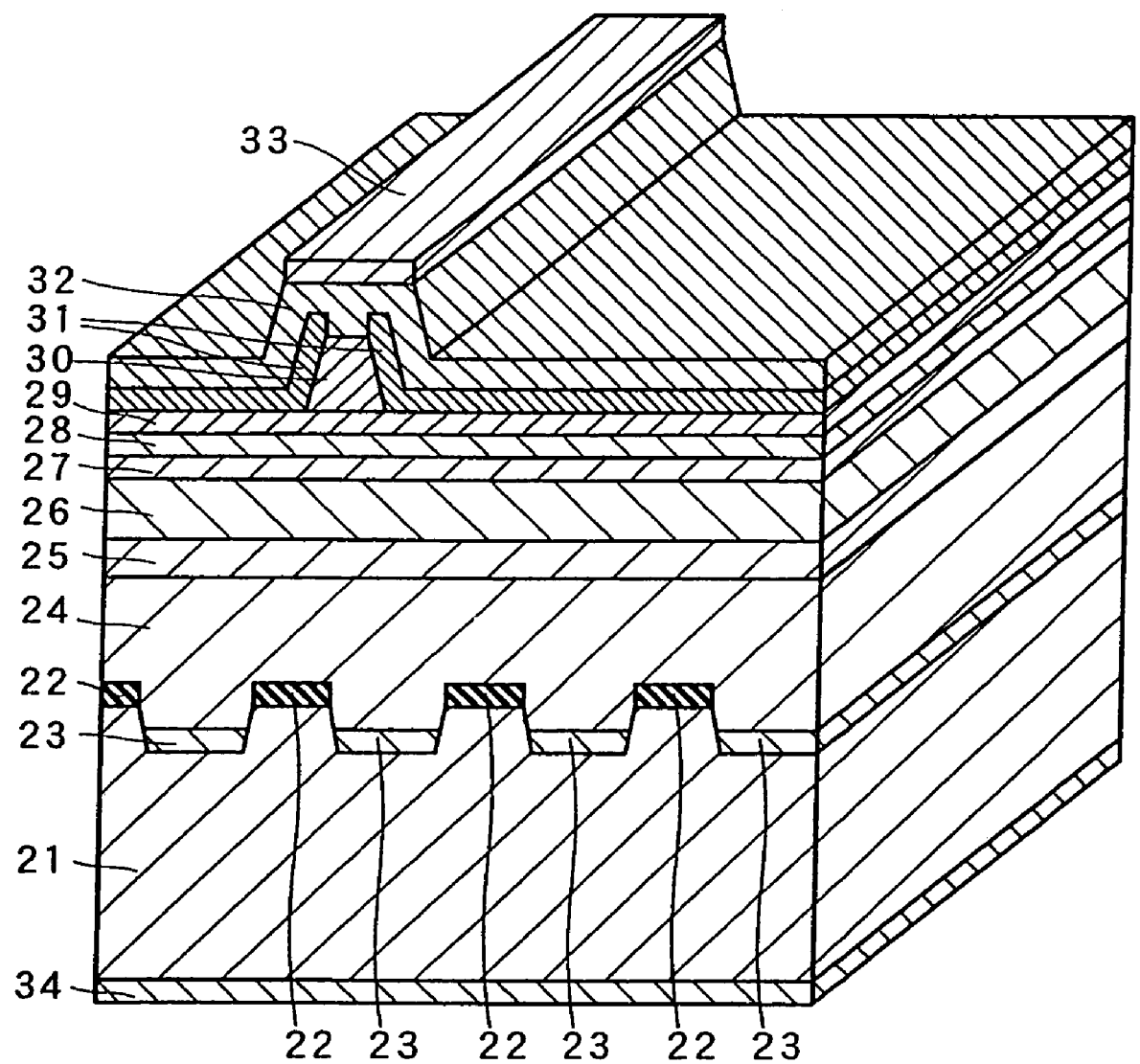
FIG. 14 is a perspective view showing a semiconductor laser device fabricated with the method of forming a nitride-based semiconductor according to the second embodiment of the present invention.

FIG. 14 is a perspective view showing a semiconductor laser device fabricated with the aforementioned method of forming a nitride-based semiconductor according to the second embodiment. The structure of the semiconductor laser device fabricated with the method of forming a nitride-based semiconductor according to the second embodiment is now described with reference to FIG. 14.

In the structure of the semiconductor laser device according to the second embodiment, an anti-cracking layer 25 of n-type AlGaInN having a thickness of about 0.1 μm, an n-type second cladding layer 26 of n-type AlGaN having a thickness of about 0.45 μm, an n-type first cladding layer 27 of n-type GaN having a thickness of about 50 nm (about 0.05 μm) and a multiple quantum well (MQW) emission layer 28 of GaInN are successively formed on the Si-doped GaN layer 24 according to the second embodiment shown in FIG. 13, as shown in FIG. 14. The MQW emission layer 28 is formed by alternately stacking five undoped GaN barrier layers of about 4 nm in thickness and four compressive strain undoped GaInN well layers of about 4 nm in thickness.

A p-type first cladding layer 29 of p-type GaN having a thickness of about 40 nm (about 0.04 μm) is formed on the MQW emission layer 28. A mesa (trapezoidal) p-type second cladding layer 30 of p-type AlGaN having a height of about 0.45 μm is formed on the p-type first cladding layer 29. Current blocking layers 31 of n-type GaN having a thickness of about 0.2 μm are formed to cover regions on the p-type first cladding layer 29 other than that formed with the p-type second cladding layer 30 and the side surfaces of the mesa p-type second cladding layer 30 while exposing the upper surface of the p-type second cladding layer 30. A p-type contact layer 32 of p-type GaN having a thickness of about 3 μm to about 5 μm is formed on the current blocking layers 31 to be in contact with the exposed upper surface of the p-type second cladding layer 30.

A p-side electrode 33 is formed on a projection portion of the p-type contact layer 32 reflecting the mesa shape of the p-type second cladding layer 30. According to the second embodiment, the Si substrate 21 has conductivity dissimilarly to the sapphire substrate 1 according to the first embodiment, and hence an n-side electrode 34 is formed on the back surface of the Si substrate 21.

The anti-cracking layer 25, the n-type second cladding layer 26, the n-type first cladding layer 27, the MQW emission layer 28, the p-type first cladding layer 29, the p-type second cladding layer 30, the current blocking layers 31 and the n-type contact layer 32 are examples of the "nitride-based semiconductor element layer having an element region" according to the present invention.

In the semiconductor laser device according to the second embodiment, the Si-doped GaN layer 24 having excellent mass productivity and low dislocation density formed by the method of forming a nitride-based semiconductor according to the second embodiment shown in FIG. 8 to 13 is employed as an underlayer for forming the layers 25 to 32 thereon as hereinabove described, whereby excellent crystallinity can be implemented in the layers 25 to 32. Consequently, a semiconductor laser device having excellent mass productivity and excellent device characteristics can be obtained.

While the sapphire substrate 1 and the Si substrate 21 are employed in the aforementioned first and second embodiments respectively, for example, the present invention is not restricted to this but a spinel substrate, an SiC substrate, a GaAs substrate, a GaP substrate, an InP substrate, a $ZrB_2$ substrate or a quartz substrate may alternatively be employed.

Further alternatively, a GaN substrate may be employed in each of the aforementioned first and second embodiments. In this case, the low-temperature buffer layers 3 or the buffer layers 23 may not necessarily be formed.

Third Embodiment

Referring to FIGS. 15 to 20, epitaxial lateral overgrowth is performed through an underlayer 43 comprising a surface having projection portions formed on a sapphire (0001) plane substrate 41 (hereinafter referred to as "sapphire substrate 41") in a third embodiment of the present invention. A method of forming a nitride semiconductor according to the third embodiment is now described in detail with reference to FIGS. 15 to 20.

Figure 15:
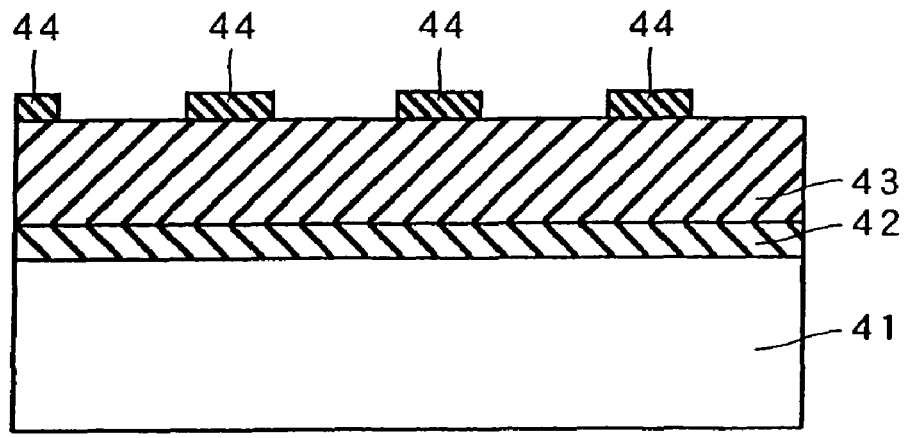
FIGS. 15 to 20 are sectional views for illustrating a method of forming a nitride-based semiconductor according to a third embodiment of the present invention.

First, low-temperature buffer layers 42 of AlGaN having a thickness of about 15 nm and the underlayer 43 of undoped GaN having a thickness of about 2 μm are formed on the sapphire substrate 41 by a crystal growth method such as MOVPE, as shown in FIG. 15. The sapphire substrate 41 is an example of the "substrate" according to the present invention. The low-temperature buffer layers 42 are examples of the "buffer layer" according to the present invention.

Striped mask layers 44 of $SiO_2$ having a thickness of about 0.5 μm are formed on the underlayer 43. The stripe patterns of the mask layers 44 are formed in a cycle of about 6 μm so that the width of the mask layers 44 is about 5 μm and the interval between each adjacent pair of mask layers 44 (the width of mask openings) is about 1 μm. The striped mask layers 44 are formed in parallel to the [11-20] direction of the underlayer 43 consisting of GaN.

Figure 16:
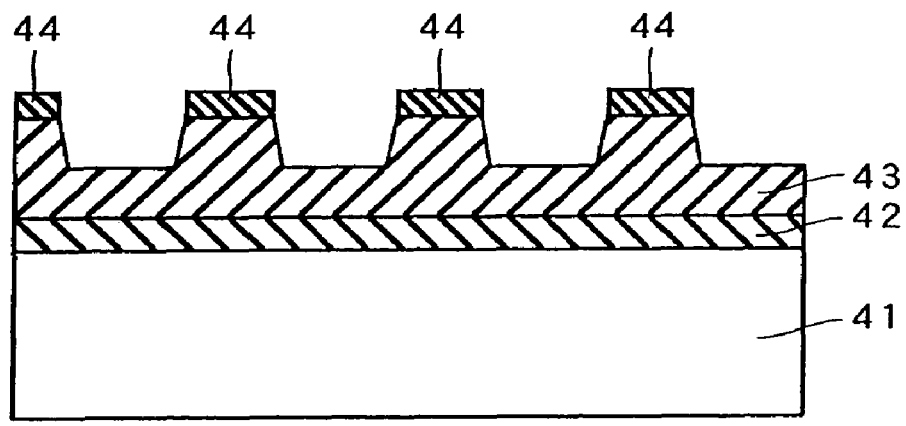

The mask layers 44 are employed as masks for etching the surface of the underlayer 43 by a thickness of about 1 μm through RIE or the like. Thus, the surface of the underlayer 43 is brought into an uneven shape, as shown in FIG. 16. The shape of the projection portions varies with etching conditions, such that upper parts of recess portions may be larger or smaller in width than bottom parts thereof. In the following description, projection portions of the etched underlayer 43 are in the form of a mesa (trapezoid). The uneven surface of the underlayer 43 has ridges of a height of about 1 μm, and they are formed in parallel to the [11-20] direction of the underlayer 43 consisting of undoped GaN.

Figure 17:
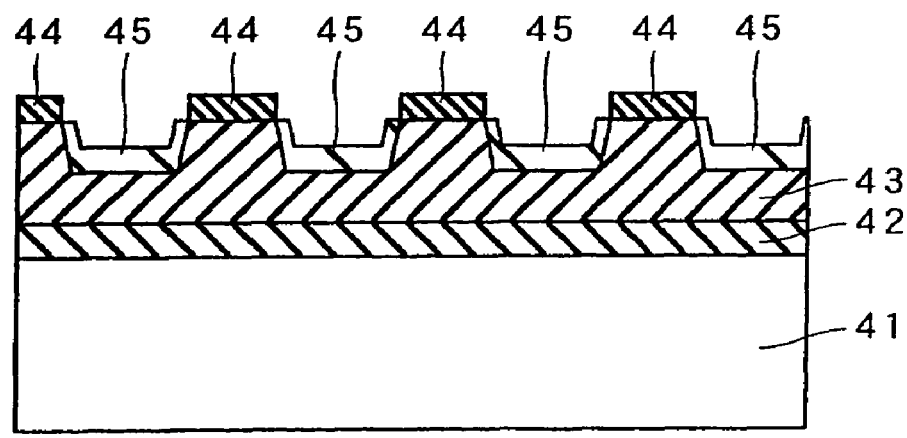

Then, undoped GaN layers 45 are re-grown from the bottom and side surfaces, serving as seed crystals, of the exposed recess portions of the underlayer 43 consisting of undoped GaN, as shown in FIG. 17. In an initial stage, the undoped GaN layers 45 are vertically (upwardly) grown from the bottom surfaces of the recess portions of the underlayer 43 and also laterally grown from the side surfaces of the recess portions of the underlayer 43, as shown in FIGS. 17 and 18.

The undoped GaN layers 45 are examples of the "first nitride-based semiconductor layer" according to the present invention.

Figure 18:
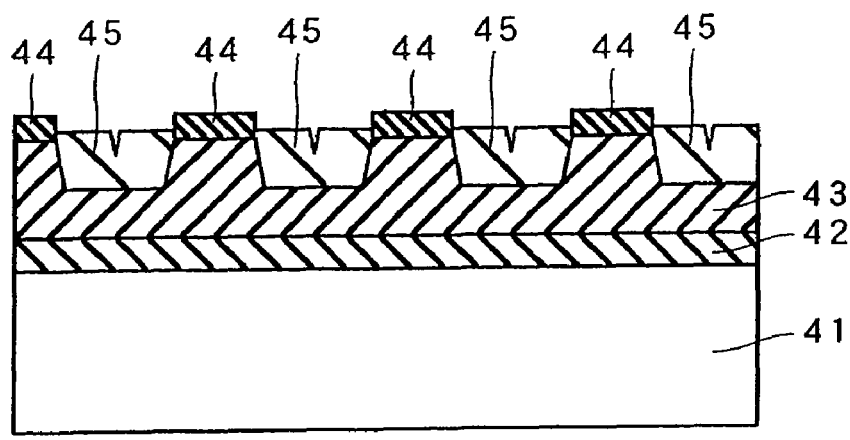
Figure 19:
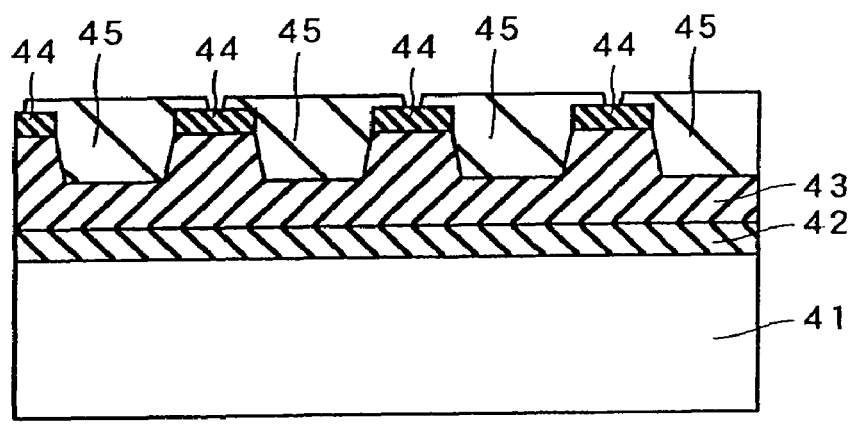
Figure 20:
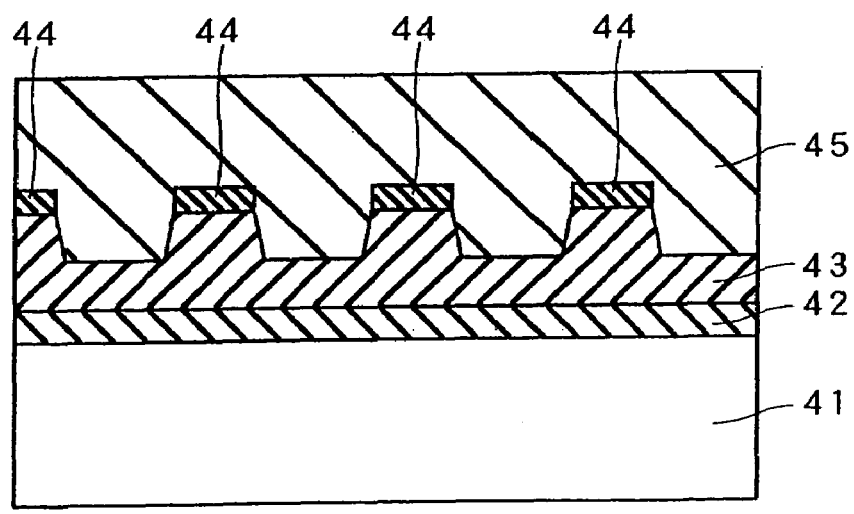

From the state shown in FIG. 18, the undoped GaN layers 45 are laterally grown on the mask layers 44, as shown in FIG. 19. The undoped GaN layers 45 laterally grown on the mask layers 44 coalesce into a continuous undoped GaN layer 45 of about 5 μm in thickness having a flattened surface, as shown in FIG. 20.

In the method of forming a nitride-based semiconductor according to the third embodiment, the undoped GaN layers 45 are grown from the bottom and side surfaces, serving as seed crystals, of the recess portions of the underlayer 43 consisting of undoped GaN as hereinabove described, whereby dislocations of the undoped GaN layers 45 are bent in the in-plane direction of the (0001) plane of the undoped GaN layers 45 when the undoped GaN layers 45 are laterally grown from the side surfaces of the recess portions of the underlayer 43 or on the mask layers 44. Thus, the dislocation density can be reduced around the surfaces of the undoped GaN layers 45.

In the method of forming a nitride-based semiconductor according to the third embodiment, the surface of the underlayer 43 is brought into an uneven shape as hereinabove described, whereby only the surface of the underlayer 43 may be etched. Thus, the etching time for forming the projection portions on the surface on the underlayer 43 can be reduced as compared with the conventional process of forming the projection portions on the surface shown in FIG. 30. Consequently, a method of forming a nitride-based semiconductor having excellent mass productivity can be obtained similarly to the first and second embodiments.

In the method of forming a nitride-based semiconductor according to the third embodiment, the underlayer 43 consisting of undoped GaN is grown after forming the low-temperature buffer layers 42 on the sapphire substrate 41, whereby the underlayer 43 having low dislocation density can be readily formed.

Figure 21:
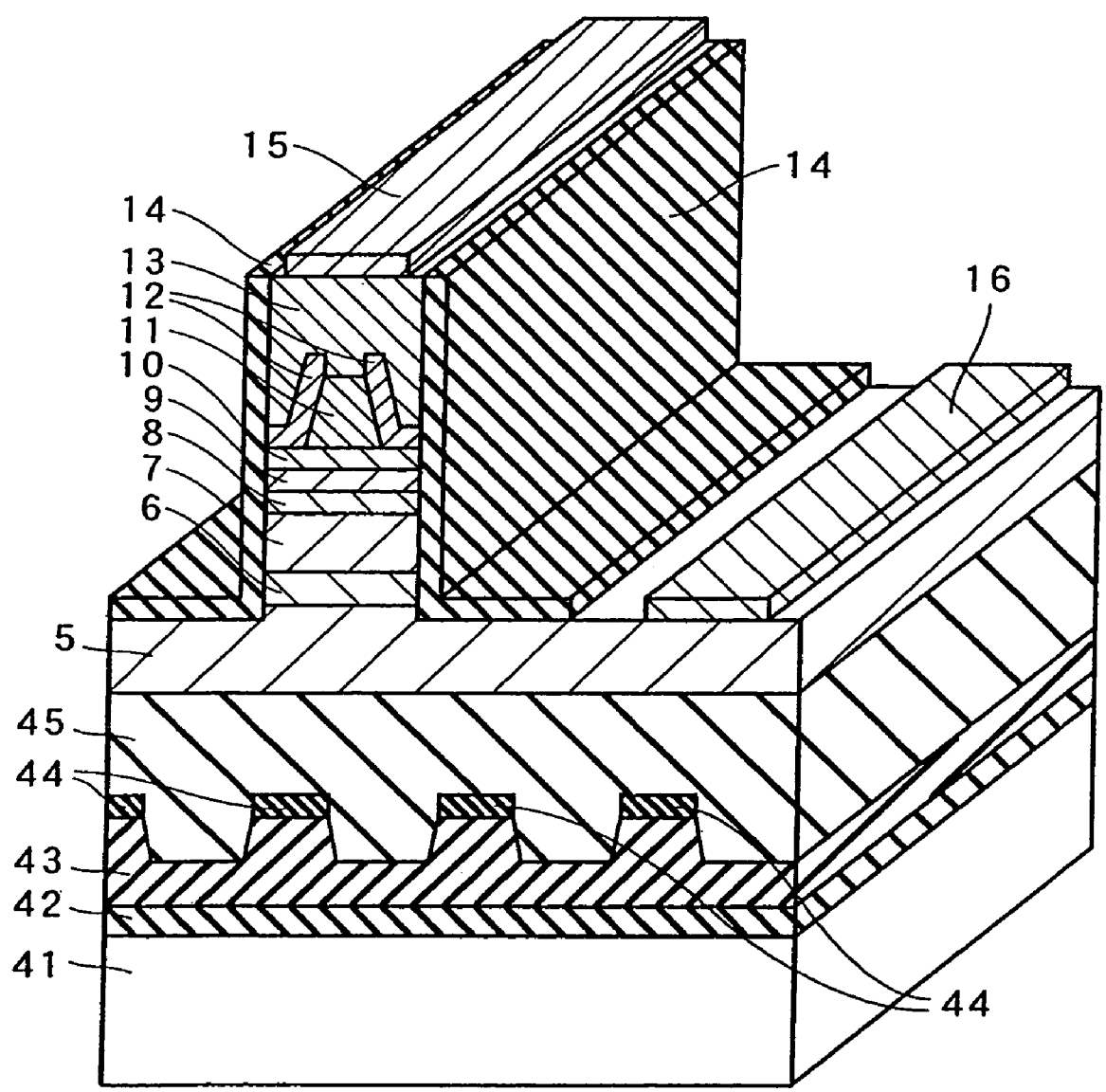
FIG. 21 is a perspective view showing a semiconductor laser device fabricated with the method of forming a nitride-based semiconductor according to the third embodiment of the present invention.

FIG. 21 is a perspective view showing a semiconductor laser device fabricated with the aforementioned method of forming a nitride-based semiconductor according to the third embodiment. The structure of the semiconductor laser device fabricated with the method of forming a nitride-based semiconductor according to the third embodiment is now described with reference to FIG. 21.

In the structure of the semiconductor laser device according to the third embodiment, an n-type contact layer 5, an anti-cracking layer 6, an n-type second cladding layer 7, an n-type first cladding layer 8, an MQW emission layer 9, a p-type first cladding layer 10, a p-type second cladding layer 11, current blocking layers 12, a p-type contact layer 13 and protective films 14 are formed on the undoped layer GaN layer 45 shown in FIG. 20, similarly to the first embodiment. The compositions and thicknesses of the layers 5 to 13 and the protective films 14 are similar to those in the first embodiment.

A p-side electrode 15 is formed on the upper surface of the p-type contact layer 13 while an n-side electrode 16 is formed on a partially removed and exposed surface of the n-type contact layer 5.

In the semiconductor laser device according to the third embodiment, the undoped GaN layer 45 having excellent mass productivity and low dislocation density formed by the method of forming a nitride-based semiconductor according to the third embodiment shown in FIG. 15 to 20 is employed as an underlayer for forming the layers 5 to 13 thereon as hereinabove described, whereby excellent crystallinity can be implemented in the layers 5 to 13. Consequently, a semiconductor laser device having excellent mass productivity and excellent device characteristics can be obtained.

Fourth Embodiment

Referring to FIGS. 22 to 27, an n-type SiC (0001) plane substrate 51 (hereinafter referred to as "SiC substrate 51") having conductivity is employed in a fourth embodiment of the present invention in place of the insulating sapphire substrate 41 employed in the third embodiment. A method of forming a nitride semiconductor according to the fourth embodiment is now described in detail with reference to FIGS. 22 to 27.

Figure 22:
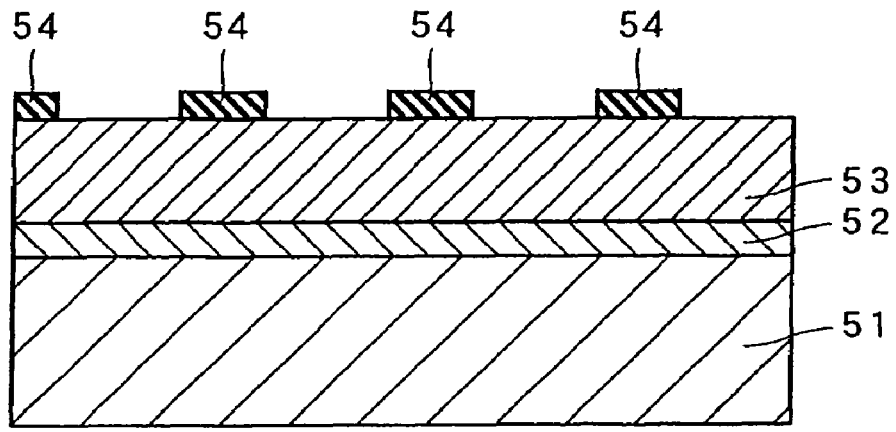
FIGS. 22 to 27 are sectional views for illustrating a method of forming a nitride-based semiconductor according to a fourth embodiment of the present invention.

First, buffer layers 52 of Si-doped AlGaN having a thickness of about 15 nm and an underlayer 53 of Si-doped GaN having a thickness of about 2 μm are formed on the n-type SiC substrate 51 by a crystal growth method such as MOVPE, as shown in FIG. 22. The SiC substrate 51 is an example of the "substrate" according to the present invention.

Striped mask layers 54 of SiO$_2$ having a thickness of about 0.5 μm are formed on the underlayer 53. The stripe patterns of the mask layers 54 are formed in a cycle of about 6 μm so that the width of the mask layers 54 is about 5 μm and the interval between each adjacent pair of mask layers 54 (the width of mask openings) is about 1 μm. The striped mask layers 54 are formed in parallel to the [11-20] direction of the underlayer 53 consisting of Si-doped GaN.

Figure 23:
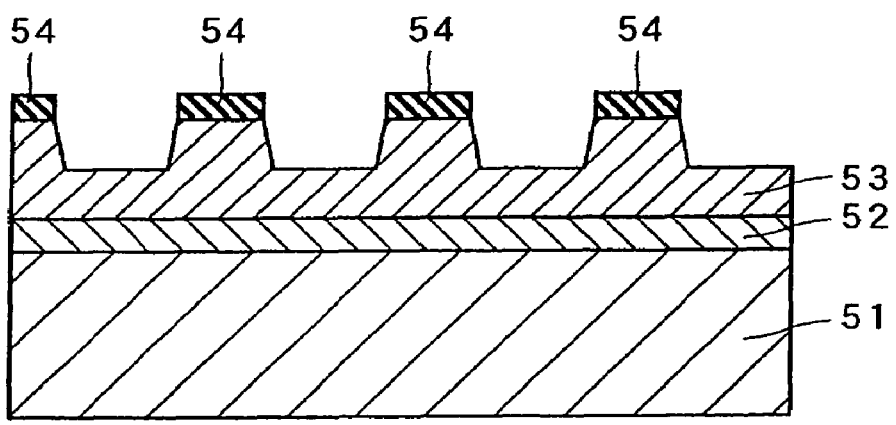

The mask layers 54 are employed as masks for etching the surface of the underlayer 53 by a thickness of about 1 μm through RIE or the like. Thus, the surface of the underlayer 53 is brought into an uneven shape, as shown in FIG. 23. The shape of the projection portions varies with etching conditions, such that upper parts of recess portions may be larger or smaller in width than bottom parts thereof. In the following description, projection portions of the etched underlayer 53 are in the form of a mesa (trapezoid). The uneven surface of the underlayer 53 has ridges of a height of about 1 μm, and they are formed in parallel to the [11-20] direction of the underlayer 53 consisting of Si-doped GaN.

Figure 24:
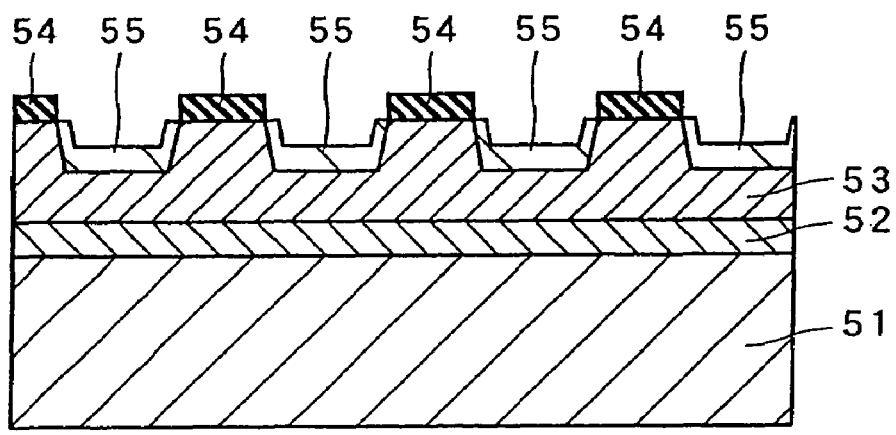
Figure 25:
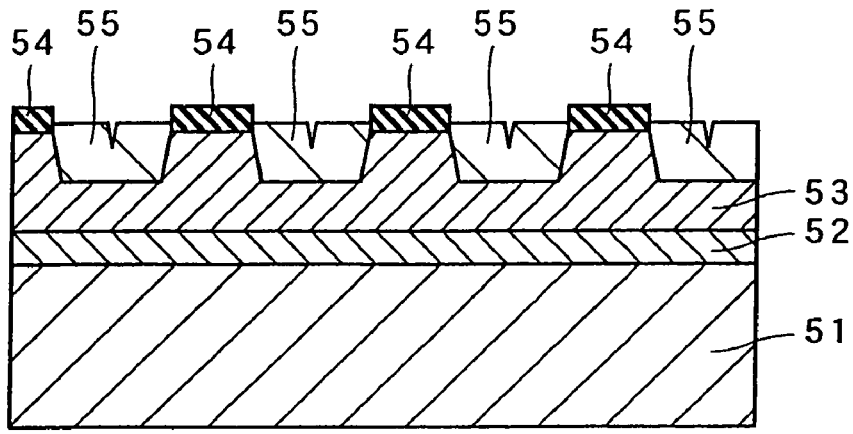

Then, Si-doped GaN layers 55 are re-grown from the bottom and side surfaces, serving as seed crystals, of the exposed recess portions of the underlayer 53 consisting of Si-doped GaN, as shown in FIG. 24. In an initial stage, the Si-doped GaN layers 55 are vertically (upwardly) grown from the bottom surfaces of the recess portions of the underlayer 53 and also laterally grown from the side surfaces of the recess portions of the underlayer 53, as shown in FIGS. 24 and 25. The Si-doped GaN layers 55 are examples of the "first nitride-based semiconductor layer" according to the present invention.

Figure 26:
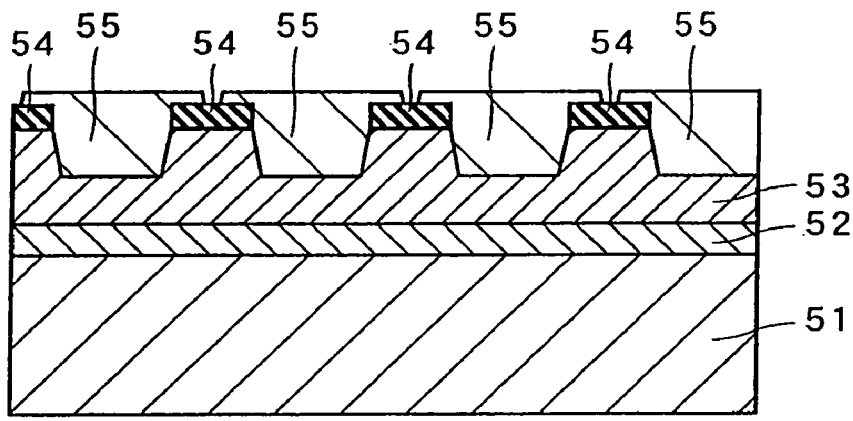
Figure 27:
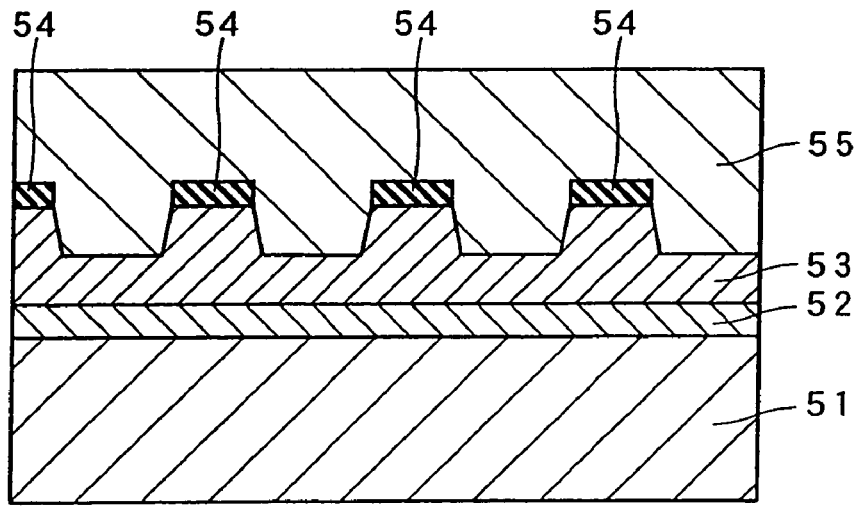

From the state shown in FIG. 25, the Si-doped GaN layers 55 are laterally grown on the mask layers 54, as shown in FIG. 26. The Si-doped GaN layers 55 laterally grown on the mask layers 54 coalesce into a continuous Si-doped GaN layer 55 of about 5 μm in thickness having a flattened surface, as shown in FIG. 27.

In the method of forming a nitride-based semiconductor according to the fourth embodiment, the Si-doped GaN layers 55 are grown from the bottom and side surfaces, serving as seed crystals, of the recess portions of the underlayer 43 consisting of Si-doped GaN as hereinabove described, whereby dislocations of the Si-doped GaN layers 55 are bent in the in-plane direction of the (0001) plane of the Si-doped GaN layers 55 when the Si-doped GaN layers 55 are laterally grown from the side surfaces of the recess portions of the underlayer 53 or on the mask layers 54. Thus, the dislocation density can be reduced around the surfaces of the Si-doped GaN layers 55.

In the method of forming a nitride-based semiconductor according to the fourth embodiment, the surface of the underlayer 53 is brought into an uneven shape as hereinabove described, whereby only the surface of the underlayer 53 may be etched. Thus, the etching time for forming the projection portions on the surface on the underlayer 53 can be reduced as compared with the conventional process of forming the projection portions on the surface shown in FIG. 30. Consequently, a method of forming a nitride-based semiconductor having excellent mass productivity can be obtained similarly to the first to third embodiments.

In the method of forming a nitride-based semiconductor according to the fourth embodiment, the underlayer 53 consisting of Si-doped GaN is grown after forming the buffer layers 52 on the SiC substrate 51, whereby the underlayer 53 having low dislocation density can be readily formed.

Figure 28:
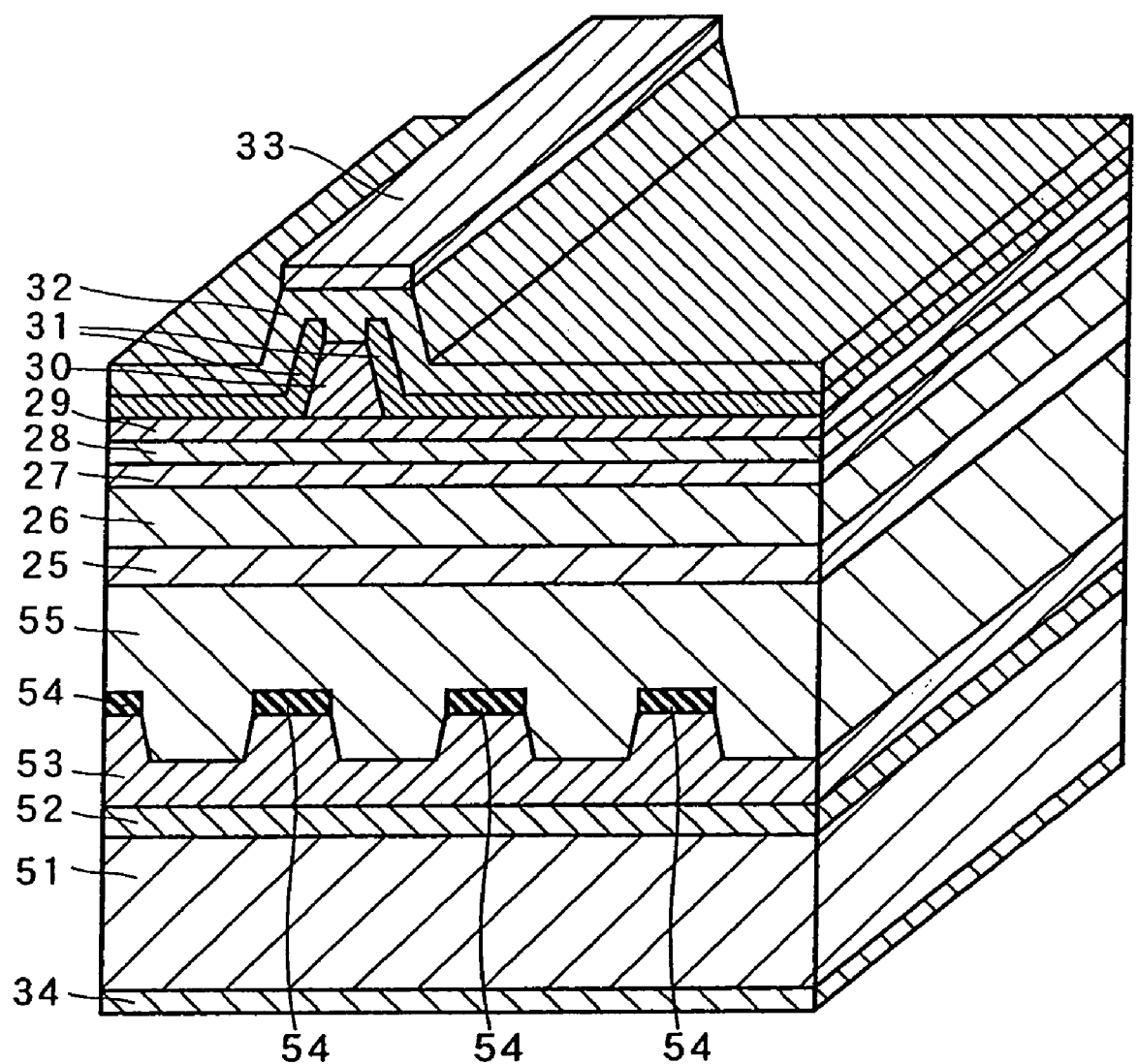
FIG. 28 is a perspective view showing a semiconductor laser device fabricated with the method of forming a nitride-based semiconductor according to the fourth embodiment of the present invention.
Figure 29:
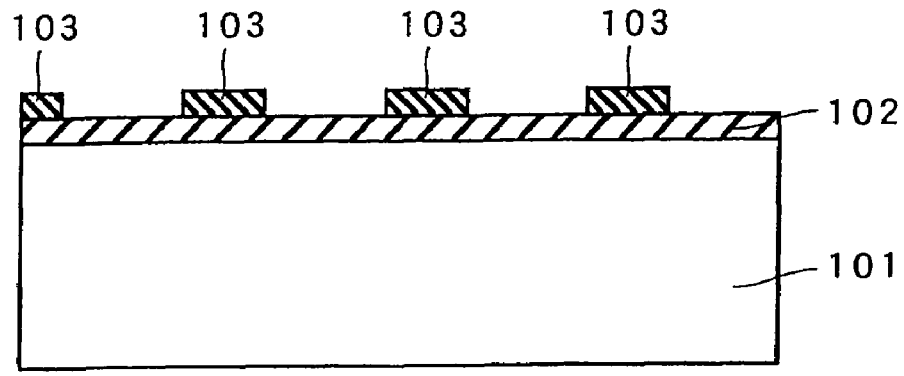
FIGS. 29 to 33 are sectional views for illustrating a conventional method of forming a nitride-based semiconductor.

FIG. 28 is a perspective view showing a semiconductor laser device fabricated with the aforementioned method of forming a nitride-based semiconductor according to the fourth embodiment. The structure of the semiconductor laser device fabricated with the method of forming a nitride-based semiconductor according to the fourth embodiment is now described with reference to FIG. 28.

In the structure of the semiconductor laser device according to the fourth embodiment, an anti-cracking layer 25, an n-type second cladding layer 26, an n-type first cladding layer 27, an MQW emission layer 28, a p-type first cladding layer 29, a p-type second cladding layer 30, current blocking layers 31 and a p-type contact layer 32 are formed on the Si-doped layer GaN layer 55 shown in FIG. 27, similarly to the second embodiment. The compositions and thicknesses of the layers 25 to 32 are similar to those in the second embodiment.

A p-side electrode 33 is formed on a projection portion of the p-type contact layer 32 reflecting the mesa shape of the p-type second cladding layer 30. The SiC substrate 51 has conductivity, and hence an n-side electrode 34 is formed on the back surface of the SiC substrate 51.

In the semiconductor laser device according to the fourth embodiment, the Si-doped GaN layer 55 having excellent mass productivity and low dislocation density formed by the method of forming a nitride-based semiconductor according to the fourth embodiment shown in FIG. 22 to 27 is employed as an underlayer for forming the layers 25 to 32 thereon as hereinabove described, whereby excellent crystallinity can be implemented in the layers 25 to 32. Consequently, a semiconductor laser device having excellent mass productivity and excellent device characteristics can be obtained.

While the sapphire substrate 41 and the SiC substrate 51 are employed in the aforementioned third and fourth embodiments respectively, for example, the present invention is not restricted to this but a spinel substrate, a GaN substrate, a GaAs substrate, a GaP substrate, an InP substrate, a $ZrB_2$ substrate or a quartz substrate may alternatively be employed.

Although the present invention has been described and illustrated in detail, it is clearly understood that the same is by way of illustration and example only and is not to be taken by way of limitation, the spirit and scope of the present invention being limited only by the terms of the appended claims.

While the recess portions of the surfaces of the sapphire substrate 1, the Si substrate 21 and the underlayers 43 and 53 are formed in the height of about 1 μm in the aforementioned first to fourth embodiments, the present invention is not restricted to this but the height of the recess portions is preferably set in the range of several nm to several μm not reaching the bottom surfaces of the sapphire substrate 1, the Si substrate 21 and the underlayers 43 and 53.

While the striped mask layers 2, 22, 44 and 54 are formed in parallel with the [1-100] direction of the sapphire substrate 1, the [1-10] direction of the Si substrate 21 and the [11-20] directions of the GaN underlayers 43 and 53 in the aforementioned first to fourth embodiments respectively, the present invention is not restricted to this but the striped mask layers may alternatively be formed in a direction different from the aforementioned ones. For example, the mask layers 44 and 45 according to the third and fourth embodiments may be formed in parallel with the [1-100] directions of the GaN underlayers 43 and 53.

While the projection portions of the surfaces of the sapphire substrate 1, the Si substrate 21 and the underlayers 43 and 53 are formed in parallel with the [1-100] direction of the sapphire substrate 1, the [1-10] direction of the Si substrate 21 and the [11-20] directions of the GaN underlayers 43 and 53 in the first to fourth embodiments respectively, the present invention is not restricted to this but the projection portions of the surface may be formed in a direction different from the above. For example, the projection portions of the surfaces of the underlayers 43 and 53 according to the third and fourth embodiments may alternatively be formed in parallel with the [1-100] directions of the GaN underlayers 43 and 53.

While the mask layers 2, 22, 44 and 54 and the openings thereof are formed in a striped shape in the aforementioned first to fourth embodiments, the present invention is not restricted to this but the mask layers may alternatively be formed in a circular, hexagonal or triangular shape, and the openings thereof may also be formed in a circular, hexagonal or triangular shape. When the mask layers and the openings thereof are formed in a hexagonal or triangular shape, the sides of the hexagons or triangles may match with any crystal orientation.

While the recess and projection portions of the surfaces of the sapphire substrate 1, the Si substrate 21 and the underlayers 43 and 53 are formed in a striped shape in the aforementioned first to fourth embodiments, the present invention is not restricted to this but the recess portions or the projection portions of the surfaces of the sapphire substrate 1, the Si substrate 21 and the underlayers 43 and 53 may alternatively be formed in a circular, hexagonal or triangular shape. When the recess or projection portions are formed in a hexagonal or triangular shape, the sides of the hexagons or triangles may match with any crystal orientation.

While the nitride-based semiconductors are employed for preparing semiconductor laser devices in the aforementioned first to fourth embodiments, the present invention is not restricted to this but also applicable to another device such as a light emitting diode device or a transistor employing a nitride-based semiconductor.

In each of the aforementioned first to fourth embodiments, the nitride-based semiconductor may have a wurtzite crystal structure or a zinc blende crystal structure.

While crystal growth of each nitride-based semiconductor layer is performed by MOVPE in the aforementioned first to fourth embodiments, the present invention is not restricted to this but crystal growth may alternatively be performed by HVPE or gas source MBE employing TMAl, TMGa, TMIn, $NH_3$, SiH or $Cp_2Mg$ as source gas.

In each of the first to fourth embodiments, the bottom surfaces of the recess portions of the surface of the sapphire substrate 1, the Si substrate 21 or the underlayer 43 or 53 are preferably formed in a width within the range of several 100 nm to several 10 μm.

While the n-type first cladding layers 8 or 27 and the p-type first cladding layers 10 or 29 consist of GaN in the aforementioned first to fourth embodiments, the present invention is not restricted to this but the first cladding layers may consist of other materials having a wider bandgap than the MQW emission layer. For example, AlGaN such as $Al_{0.01}Ga_{0.99}N$, InGaN such as $In_{0.01}Ga_{0.99}N$, or AlGaInN such as $Al_{0.01}Ga_{0.98}In_{0.01}N$ may be employed as the materials constituting the first cladding layers.

What is claimed is:

1. A nitride-based semiconductor light-emitting device comprising:
    a substrate comprising a surface having projection portions and recess portions;
    a buffer layer formed on bottom surfaces of said recess portions; and
    a nitride-based semiconductor layer formed on said buffer layer,
    an n-type layer, an emission layer, and a p-type layer, formed on said nitride-based semiconductor layer
    wherein said bottom surfaces of said recess portions are formed in a width within the range of several 100 nm to several 10 μm and said recess portions are formed in a height within the range of several nm to several μm, and
    wherein said nitride-based semiconductor layer includes an undoped layer.

2. The nitride-based semiconductor light-emitting device according to claim 1, wherein
    said nitride-based semiconductor layer has a flat surface.

3. The nitride-based semiconductor light-emitting device according to claim 1, wherein
    said substrate includes a substrate selected from a group consisting of a sapphire substrate, an SiC substrate, a GaN substrate, a GaAs substrate, a GaP substrate, an InP substrate, a $ZrB_2$ substrate and a quartz substrate.

4. The nitride-based semiconductor light-emitting device according to claim 1, wherein
    said recess portions or said projection portions are formed in a circular, hexagonal or triangular shape in a plan view.

5. A nitride-based semiconductor light-emitting device comprising:
    a substrate comprising a surface having projection portions and recess portions;
    a buffer layer formed on bottom surfaces of said recess portions; and
    a nitride-based semiconductor layer formed on said buffer layer,
    an n-type layer, an emission layer, and a p-type layer, formed on said nitride-based semiconductor layer,
    wherein the width of said recess portions is larger than the height of said recess portions, and
    wherein said nitride-based semiconductor layer includes an undoped layer.

6. The nitride-based semiconductor light-emitting device according to claim 5, wherein
    said nitride-based semiconductor layer has a flat surface.

7. The nitride-based semiconductor light-emitting device according to claim 5, wherein
    said substrate includes a substrate selected from a group consisting of a sapphire substrate, an SiC substrate, a GaN substrate, a GaAs substrate, a GaP substrate, an InP substrate, a $ZrB_2$ substrate and a quartz substrate.

8. The nitride-based semiconductor light-emitting device according to claim 5, wherein
    said recess portions or said projection portions are formed in a circular, hexagonal or triangular shape in a plan view.

9. The nitride-based semiconductor light-emitting device according to claim 5, wherein said bottom surfaces of said recess portions are formed in a width within the range of several 100 nm to several 10 μm and said recess portions are formed in a height within the range of several nm to several μm.

10. The nitride-based semiconductor light-emitting device according to claim 2, wherein said undoped layer has a flat surface.

11. The nitride-based semiconductor light-emitting device according to claim 6, wherein said undoped layer has a flat surface.

* * * * *